(12) United States Patent
Hamamura et al.

(10) Patent No.: US 10,418,169 B2
(45) Date of Patent: Sep. 17, 2019

(54) INDUCTANCE ELEMENT FOR MAGNETIC SENSOR AND CURRENT SENSOR INCLUDING THE SAME

(71) Applicant: TDK Corporation, Tokyo (JP)

(72) Inventors: Takahiro Hamamura, Tokyo (JP); Takashi Osada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 127 days.

(21) Appl. No.: 15/808,747

(22) Filed: Nov. 9, 2017

(65) Prior Publication Data

US 2018/0137969 A1 May 17, 2018

(30) Foreign Application Priority Data

Nov. 16, 2016 (JP) .................................. 2016-222909

(51) Int. Cl.
| | |
|---|---|
| *G01R 33/05* | (2006.01) |
| *H01F 27/34* | (2006.01) |
| *H01F 27/24* | (2006.01) |
| *H01F 27/28* | (2006.01) |
| *G01R 33/00* | (2006.01) |
| *H01F 17/04* | (2006.01) |
| *H01F 27/36* | (2006.01) |
| *H01F 3/14* | (2006.01) |

(52) U.S. Cl.
CPC .......... *H01F 27/34* (2013.01); *G01R 33/0076* (2013.01); *G01R 33/05* (2013.01); *H01F 17/04* (2013.01); *H01F 27/24* (2013.01); *H01F 27/2804* (2013.01); *H01F 27/365* (2013.01); *H01F 3/14* (2013.01); *H01F 2027/2809* (2013.01)

(58) Field of Classification Search
CPC .............. G01R 33/0206; G01R 33/028; G01R 33/038; G01R 33/1215
See application file for complete search history.

(56) References Cited

U.S. PATENT DOCUMENTS

| | | | | |
|---|---|---|---|---|
| 5,930,095 | A | * | 7/1999 | Joo ........................ H01F 6/06 361/19 |
| 7,606,008 | B2 | * | 10/2009 | Sbiaa .................... B82Y 25/00 360/324.11 |
| 2012/0249282 | A1 | | 10/2012 | Sin et al. |
| 2019/0113544 | A1 | * | 4/2019 | Osada ................. G01R 15/185 |

FOREIGN PATENT DOCUMENTS

| | | |
|---|---|---|
| JP | 2009002818 A | 1/2009 |
| WO | 2010134348 A1 | 11/2010 |

* cited by examiner

*Primary Examiner* — Tung X Nguyen
(74) *Attorney, Agent, or Firm* — Young Law Firm, P.C.

(57) ABSTRACT

Disclosed herein is an inductance element that includes a base body, a saturable magnetic thin-plate core provided on the base body, and a coil conductor wound around the saturable magnetic thin-plate core. The saturable magnetic thin-plate core includes a first section linearly extending in a first direction and a second section having a meander-shaped, and the coil conductor is wound around the first section of the saturable magnetic thin-plate core.

16 Claims, 28 Drawing Sheets

INDUCTANCE ELEMENT FOR MAGNETIC SENSOR AND CURRENT SENSOR INCLUDING THE SAME

BACKGROUND OF THE INVENTION

Field of the Invention

The present invention relates to an inductance element for a magnetic sensor and a magnetic sensor provided therewith and, more particularly, to an inductance element for a fluxgate type magnetic sensor and a magnetic sensor provided therewith.

Description of Related Art

A fluxgate type magnetic sensor is known as a magnetic sensor for detecting an external magnetic field. International Publication No. 2010/134348 and JP 2009-002818A each disclose an example of the fluxgate type magnetic sensor.

The fluxgate type magnetic sensors described respectively in International Publication No. 2010/134348 and JP 2009-002818A have a fluxgate core formed on a substrate and a solenoid coil wound around the fluxgate core. In the fluxgate type magnetic sensor described in International Publication No. 2010/134348, the fluxgate core linearly extends in one direction, whereby magnetic flux generated in that direction can be detected. On the other hand, in the fluxgate type magnetic sensor described in JP 2009-002818A, the fluxgate core has a loop shape, whereby a closed magnetic path is formed.

However, in the fluxgate type magnetic sensor described in International Publication No. 2010/134348, the fluxgate core has a linear shape, so that the length of the fluxgate core needs to be increased in one direction in order to suppress influence of a demagnetizing field, thus disadvantageously involving increase in the size of an element. Further, in the fluxgate type magnetic sensor described in JP 2009-002818A, the size of the loop-shaped fluxgate core needs to be increased in order to enhance detection sensitivity. Also in this case, the size of an element is disadvantageously increased.

SUMMARY

It is therefore an object of the present invention to provide an inductance element for a fluxgate type magnetic sensor having a small size and high detection sensitivity and a magnetic sensor provided therewith.

An inductance element for a magnetic sensor according to the present invention includes a base body, a saturable magnetic thin-plate core provided on the base body, and a coil conductor wound around the saturable magnetic thin-plate core. The saturable magnetic thin-plate core includes a first section linearly extending in a first direction and a meander-shaped second section. The coil conductor is wound around the first section of the saturable magnetic thin-plate core.

Further, a magnetic sensor according to the present invention includes the above inductance element for a magnetic sensor and a detection circuit connected to the coil conductor.

According to the present invention, the saturable magnetic thin-plate core includes the linear-shaped first section and the meander-shaped second section, so that it is possible to increase the effective magnetic path of the saturable magnetic thin-plate core without increasing the physical length thereof. In addition, the coil conductor is wound around the liner-shaped first section, so that it is possible to magnetically couple the coil conductor and saturable magnetic thin-plate core efficiently. As a result, an inductance element for a fluxgate type magnetic sensor having a small size and high detection sensitivity and a magnetic sensor provided therewith can be provided.

In the present invention, the saturable magnetic thin-plate core may further include a meander-shaped third section, and both ends of the first section may be connected to the second and third sections, respectively. With this configuration, a plurality of the meander-shaped sections are provided, so that it is possible to further increase the effective magnetic path of the saturable magnetic thin-plate core without increasing the size of an element. Alternatively, the saturable magnetic thin-plate core may further include a fourth section linearly extending in the first direction, and both ends of the second section may be connected to the first and fourth sections, respectively. With this configuration, a plurality of the linear-shaped sections are provided, so that it is possible to increase the number of turns of the coil conductor.

In the present invention, the base body may have a shape including a first mounting area having a first width in a second direction perpendicular to the first direction and a second mounting area having a second width in the second direction larger than the first width, the first section of the saturable magnetic thin-plate core may be provided on the first mounting area of the base body, the second section of the saturable magnetic thin-plate core may be provided on the second mounting area of the base body, and the coil conductor may be wound around the first mounting area of the base body. With this configuration, a simple inductance element for a magnetic sensor using a bulk base body can be provided.

In this case, the inductance element preferably further includes a terminal electrode provided on the second mounting area of the base body so as to be connected to the end portion of the coil conductor. With this configuration, an inductance element of a surface-mount type can be provided.

Further, the inductance element according to the present invention may further include a magnetic shield fixed to the second mounting area of the base body so as to detour magnetic flux generated in the second direction. With this configuration, it is possible enhance selectivity with respect to magnetic flux in the first direction.

In the present invention, the base body may include a plurality of laminated insulating substrates, the saturable magnetic thin-plate core may be formed on a first surface included in the plurality of insulating substrates, and the coil conductor may include first and second planar coil patterns formed on respective second and third surfaces included in the plurality of insulating substrates different from the first surface and a first through hole conductor formed so as to penetrate at least one of the plurality of insulating substrates so as to connect the first and second planar conductor patterns. With this configuration, it is possible to produce an inductance element for a magnetic sensor by using a lamination process.

In this case, the plurality of insulating substrates includes at least first, second, third, and fourth insulating substrates laminated in this order, and it is preferable that the first surface is positioned between the second and third insulating substrates, the second surface is positioned between the first and second insulating substrates, and the third surface is positioned between the third and fourth insulating substrates. With this configuration, the first to third surfaces are not exposed outside, thus making it possible to increase reliability of the obtained product.

Further, the inductance element according to the present invention may further include a bus bar layer which is formed on a fourth surface included in the plurality of insulating substrates different from the first to third surfaces and through which a current to be measured flows. With this configuration, it is possible to apply a magnetic field generated by the current to be measured flowing through the bus bar layer to the saturable magnetic thin-plate core.

In the present invention, the saturable magnetic thin-plate core may include first and second saturable magnetic thin-plate cores, the coil conductor may include first and second coil conductors, the first coil conductor may be wound around the first section of the first saturable magnetic thin-plate core, the second coil conductor may be wound around the first section of the second saturable magnetic thin-plate core, the plurality of insulating substrates may further include fifth to seventh surfaces different from the first to fourth surfaces, the first saturable magnetic thin-plate core may be formed on the first surface, the first coil conductor may include the first and second planar conductor patterns formed on the respective second and third surfaces and the first through hole conductor, the second saturable magnetic thin-plate core may be formed on the fifth surface, the second coil conductor may include third and fourth planar conductor patterns formed on the respective sixth and seventh surfaces and a second through hole conductor formed so as to penetrate at least one of the plurality of insulating substrates so as to connect the third and fourth planar conductor patterns, and the fourth surface may be positioned between the first to third surfaces and the fifth to seventh surfaces. According to the present invention, it is possible to obtain a differential signal based on the current to be measured flowing through the bus bar layer while suppressing increase in the planar size of an element.

In the present invention, the saturable magnetic thin-plate core may include first and second saturable magnetic thin-plate cores, the coil conductor may include first and second coil conductors, the first coil conductor may be wound around the first section of the first saturable magnetic thin-plate core, the second coil conductor may be wound around the first section of the second saturable magnetic thin-plate core, both the first and second saturable magnetic thin-plate cores may be formed on the first surface, the first coil conductor may include the first and second planar conductor patterns formed on the respective second and third surfaces and the first through hole conductor, the second coil conductor may include third and fourth planar conductor patterns formed on the respective second and third surfaces and a second through hole conductor formed so as to penetrate at least one of the plurality of insulating substrates so as to connect the third and fourth planar conductor patterns, the bus bar layer may include a first bus bar pattern formed so as to overlap the first saturable magnetic thin-plate core when viewed in the lamination direction and a second bus bar pattern formed so as to overlap the second saturable magnetic thin-plate core when viewed in the lamination direction, and the current to be measured may flow in the mutually opposite directions through the first and second bus bar patterns. According to the present invention, it is possible to obtain a differential signal based on the current to be measured flowing through the bus bar layer while suppressing increase in the height of an element.

Further, the inductance element according to the present invention may further include a magnetic shield formed on an eighth surface included in the plurality of insulating substrates different from the first to third surfaces so as to detour magnetic flux generated in the second direction perpendicular to the first direction. This configuration makes it possible to enhance selectivity with respect to magnetic flux in the first direction.

In this case, the magnetic shield preferably has a gap serving as magnetic resistance against magnetic flux generated in the first direction. With this configuration, magnetic flux to be detected becomes harder to pass through the magnetic shield, thereby making it possible to prevent deterioration in detection sensitivity due to existence of the magnetic shield.

In the present invention, the coil conductor may include a detection coil and a compensation coil wounded in common around the first section of the saturable magnetic thin-plate core. With this configuration, an inductance element for a magnetic sensor suitable for closed-loop control can be provided.

In the present invention, the saturable magnetic thin-plate core is preferably made of amorphous magnetic metal. With this configuration, an inductance element for a magnetic sensor having high sensitivity can be provided at low cost.

As described above, according to the present invention, there can be provided an inductance element for a fluxgate type magnetic sensor having a small size and high detection sensitivity and a magnetic sensor provided therewith.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 10A is a schematic perspective view, and FIG. 10B is an exploded perspective view;

DETAILED DESCRIPTION OF THE EMBODIMENTS

Preferred embodiments of the present invention will now be explained in detail with reference to the drawings.

First Embodiment

Figure 1:
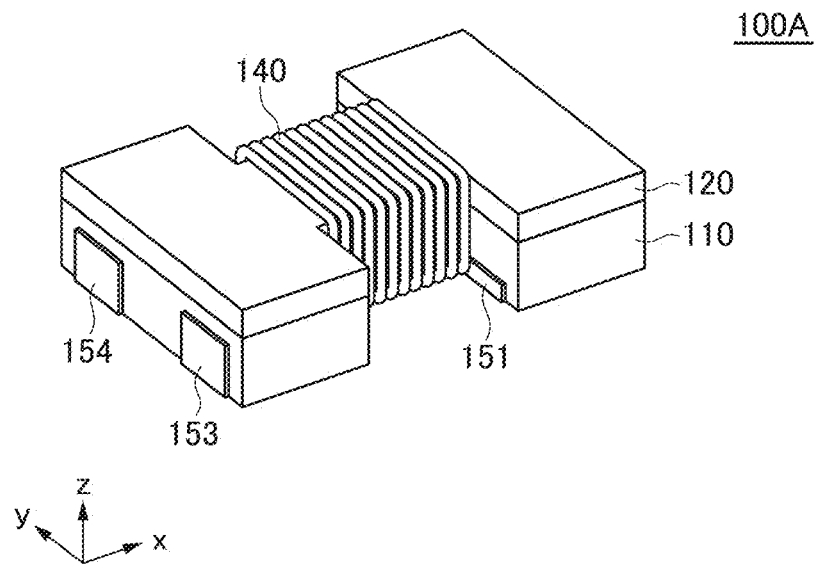
FIG. 1 is a schematic perspective view illustrating the outer appearance of an inductance element for a magnetic sensor according to a first embodiment of the present invention.
Figure 2:
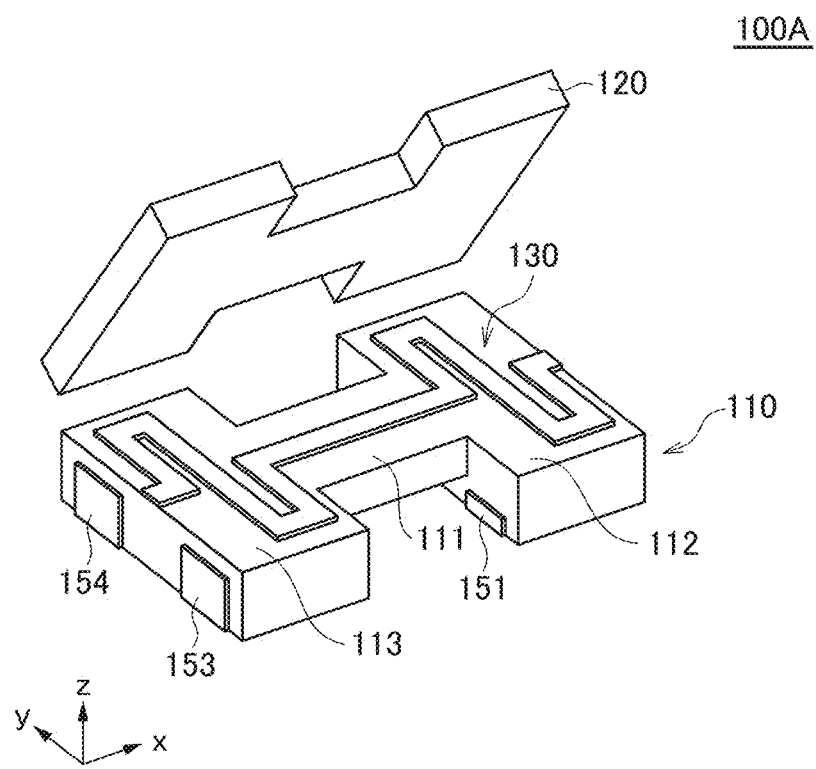
FIG. 2 is an exploded perspective view of the inductance element for a magnetic sensor shown in FIG. 1.

FIG. 1 is a schematic perspective view illustrating the outer appearance of an inductance element 100A for a magnetic sensor according to the first embodiment of the present invention. FIG. 2 is an exploded perspective view of the inductance element 100A for a magnetic sensor.

As illustrated in FIGS. 1 and 2, the inductance element 100A for a magnetic sensor according to the present embodiment has first and second insulating substrates 110 and 120 each having a substantially H-like shape in a plan view (when viewed in the illustrated z-direction), a saturable magnetic thin-plate core 130 sandwiched between the first and second insulating substrates 110 and 120, and a coil conductor 140 wound around the first and second insulating substrates 110 and 120. In FIG. 2, illustration of the coil conductor 140 is omitted.

The first and second insulating substrates 110 and 120 are each a bulk base body that supports the saturable magnetic thin-plate core 130 and coil conductor 140 and are each made of a ceramic-based insulating material such as LTCC, a monocrystalline or polycrystalline insulating material such as alumina, magnesium oxide, or lanthanum aluminate, or a resin-based insulating material such as glass epoxy.

Figure 3:
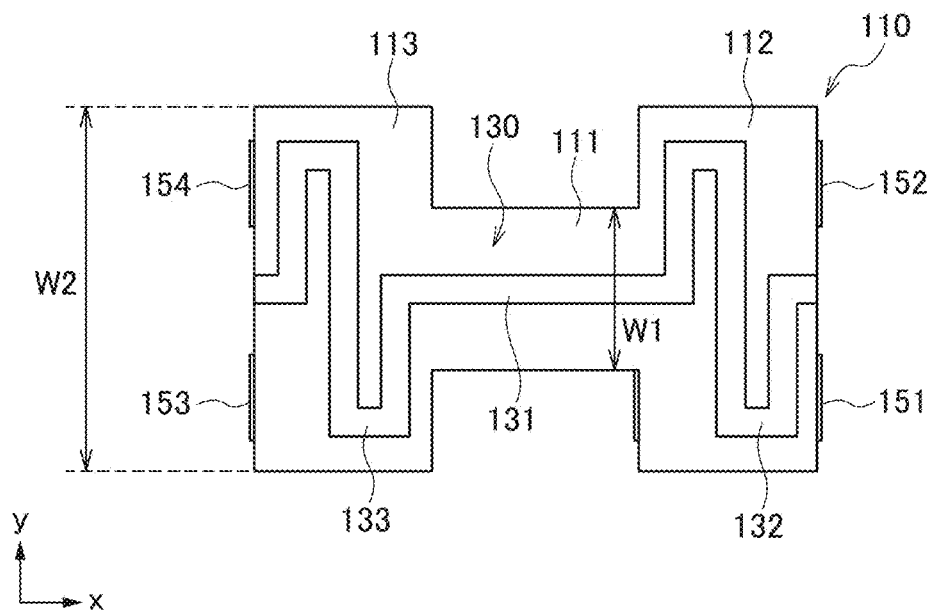
FIG. 3 is a top view of the inductance element for a magnetic sensor shown in FIG. 1 in a state where the second insulating substrate and the coil conductor are removed.

FIG. 3 is a top view of the inductance element 100A for a magnetic sensor in a state where the second insulating substrate 120 and the coil conductor 140 are removed.

As illustrated in FIG. 3, the first insulating substrate 110 has a first mounting area 111 positioned at the center in the x-direction and second and third mounting areas 112 and 113 positioned at both sides in the x-direction when viewed from the first mounting area 111. A width W2 of each of the second and third mounting areas 112 and 113 in the y-direction is larger than a width W1 of the first mounting area 111 in the y-direction. Further, the thickness of each of the second and third mounting areas 112 and 113 is larger in the z-direction than the thickness of the first mounting area 111. The second insulating substrate 120 has the same planar shape (shape in the xy plane) as that of the first insulating substrate 110; however, in the present embodiment, the thickness of the second insulating substrate 120 in the z-direction is uniform and smaller than the thickness of the first insulating substrate 110 in the z-direction. When the first and second insulating substrates 110 and 120 are put one over the other, a bobbin-shaped substrate is obtained.

The saturable magnetic thin-plate core 130 is a thin plate made of a soft magnetic material having high permeability and has a thickness of, e.g., 10 μm to several hundred μm. Although not especially limited, a Fe/Co amorphous magnetic metal is preferably used as the material of the saturable magnetic thin-plate core 130. The Fe/Co amorphous magnetic metal is significantly higher in permeability than a magnetic material such as ferrite, so that a weak magnetic field can be detected with high sensitivity.

The saturable magnetic thin-plate core 130 maybe formed by bonding a Fe/Co amorphous magnetic thin plate previously formed into a predetermined planar shape to the first insulating substrate 110. Alternatively, the saturable magnetic thin-plate core 130 may be formed by forming a Fe/Co amorphous magnetic material on the surface of the first insulating substrate 110 by sputtering or the like, followed by pattering. Wet-etching is preferably used as the patterning method in terms of cost. In this case, a photoresist is applied onto the Fe/Co amorphous magnetic material by a spin-coating method, and then an exposing device is used to perform exposure. At this time, a glass mask on which a negative pattern is printed is interposed between an exposing part of the exposing device and the photoresist so as to expose only a non-etched area. Then, the first insulating substrate 110 is put into an etching solution to remove unnecessary Fe/Co amorphous magnetic material, and then the photoresist is removed by a remover, whereby the saturable magnetic thin-plate core 130 having a desired planar shape can be obtained.

As illustrated in FIG. 3, the saturable magnetic thin-plate core 130 has a first section 131 formed on the first mounting area 111, a second section 132 formed on the second mounting area 112, and a third section 133 formed on the third mounting area 113. The first section 131 linearly extends in the x-direction. One end of the first section 131 is connected to one end of the second section 132, and the other end thereof is connected to one end of the third section 133.

The second and third sections 132 and 133 each extend in a meander shape, that is, each have a component extending in the y-direction. With this configuration, the effective magnetic path of the saturable magnetic thin-plate core 130 is made larger than the physical length thereof in the x-direction. The other ends of the second and third sections 132 and 133 are opened in the x-direction. In the example of FIGS. 2 and 3, each of the second and third sections 132 and 133 has two folded-back portions folded back in the y-direction; however, the present invention is not limited to this, but each of the second and third sections 132 and 133 may have three or more folded-back portions. Further, in the folded-back portion, the saturable magnetic thin-plate core 130 need not be turned at right angles, but may be curvedly turned.

The saturable magnetic thin-plate core 130 having such a shape is sandwiched between the first and second insulating substrates 110 and 120 to be physically protected. The surface of each of the first and second insulating substrates 110 and 120 may be flat; however, when a recessed portion for housing the saturable magnetic thin-plate core 130 is formed on the surface of one or both of the first and second insulating substrates 110 and 120, no physical stress is applied to the saturable magnetic thin-plate core 130.

The coil conductor 140 is wound around the first mounting area 111 in a state where the first and second insulating substrates 110 and 120 are put one over the other. That is, the coil conductor 140 is wound around the first section 131 of the saturable magnetic thin-plate core 130. The first mounting area 111 has a y-direction width smaller than those of the second and third mounting areas 112 and 113. Thus, coming-off of the coil conductor 140 can be prevented and, at the same time, the hollow core part is reduced to allow effective magnetic coupling with the saturable magnetic thin-plate core 130. Further, the first mounting area 111 of the first insulating substrate 110 has a reduced thickness, so that when the inductance element 100A for a magnetic sensor is mounted on a printed circuit board, interference between the coil conductor 140 and the printed circuit board is prevented.

The number of wires constituting the coil conductor 140 is not especially limited. In the present embodiment, the coil conductor 140 includes two wires. One ends of the two wires are connected respectively to terminal electrodes 151 and 152 provided in the second mounting area 112 of the first insulating substrate 110, and the other ends thereof are connected respectively to terminal electrodes 153 and 154 provided in the third mounting area 113 of the first insulating substrate 110. When one of the two wires constituting the coil conductor 140 is used as a detection coil of the magnetic sensor, and the other one thereof is used as a compensation coil of the magnetic sensor, so-called closed-loop control can be achieved.

Figure 4:
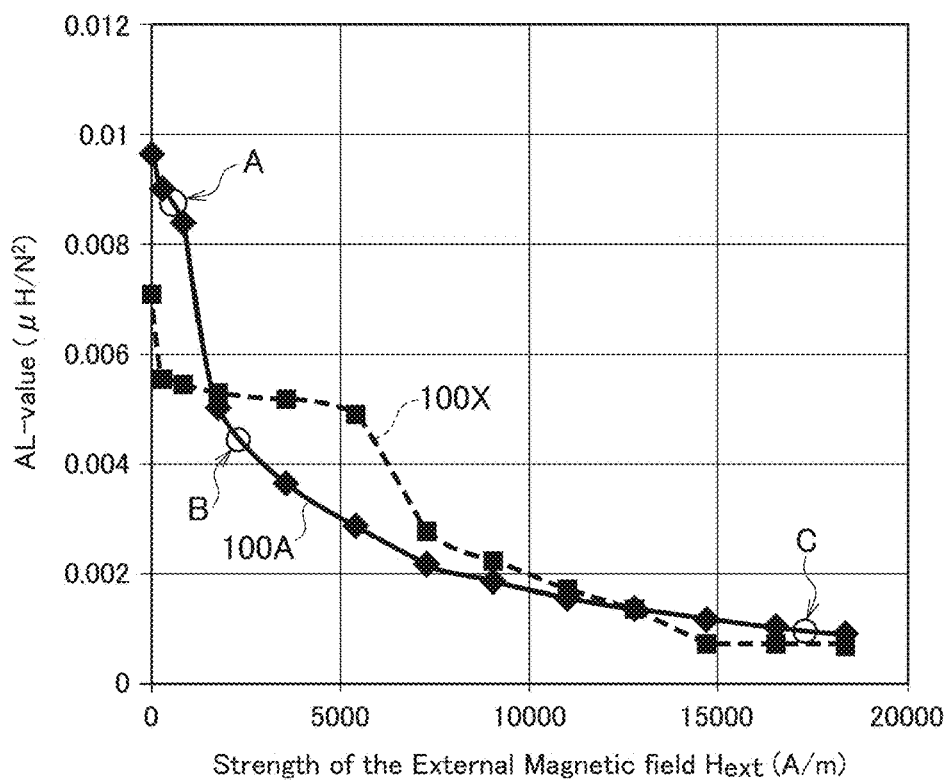
FIG. 4 is a graph illustrating the magnetic characteristics of the inductance element for a magnetic sensor shown in FIG. 1.

FIG. 4 is a graph illustrating the magnetic characteristics of the inductance element 100A for a magnetic sensor according to the present embodiment. In FIG. 4, the continuous line indicates the magnetic characteristics of the inductance element 100A for a magnetic sensor according to the present embodiment, and the dashed line indicates the magnetic characteristics of an inductance element 100X for a magnetic sensor according to a comparative example. The inductance element 100X for a magnetic sensor according to the comparative example is the same as the inductance element 100A for a magnetic sensor according to the present embodiment in terms of the size (physical length) in the x-direction; however, the saturable magnetic thin-plate core 130 extends linearly as a whole and has no meander-shaped section.

In the graph of FIG. 4, the horizontal axis represents the strength ($H_{ext}$) of an external magnetic field, and the vertical axis represents the inductance (AL-Value) per one turn of the coil conductor 140. As illustrated, in the case of the inductance element 100A for a magnetic sensor according to the present embodiment, a characteristic in which inductance steeply and linearly changes according to a change in the external magnetic field is obtained. On the other hand, in the case of the inductance element 100X for a magnetic sensor according to the comparative example, not only inductance complicatedly changes according to a change in the external magnetic field, but also there exists a magnetic field area where inductance hardly changes, making it difficult to measure the magnetic field strength correctly. The reason that such a difference occurs between the inductance elements 100A and 100X for a magnetic sensor is that influence of a demagnetizing field is reduced in the inductance element 100A for a magnetic sensor since the effective magnetic path of the saturable magnetic thin-plate core 130 is longer in the inductance element 100A for a magnetic sensor than in the inductance element 100X for a magnetic sensor even though the physical length thereof is the same therebetween.

Figure 5A:
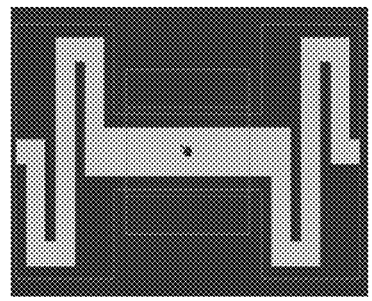
FIGS. 5A to 5C are views illustrating specific permeability distributions of the saturable magnetic thin-plate core in the areas A to C shown in FIG. 4, respectively.
Figure 5B:
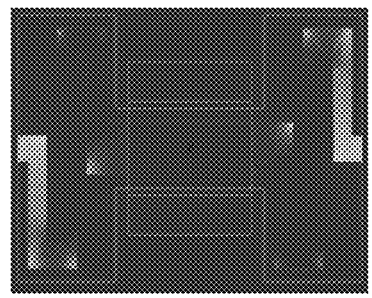
Figure 5C:
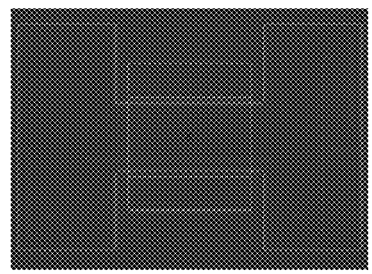

FIGS. 5A to 5C are views illustrating specific permeability distributions of the saturable magnetic thin-plate core 130 in the areas A to C shown in FIG. 4, respectively. In FIGS. 5A to 5C, a brighter part has a higher specific permeability, and a darker part has a lower specific permeability.

As illustrated in FIG. 5A, in the area A where the external magnetic field is weak, the saturable magnetic thin-plate core 130 is not saturated and thus has a sufficiently high specific permeability as a whole. As illustrated in FIG. 5B, in the area B where the external magnetic field is at an intermediate level, saturation starts from the first section 131 of the saturable magnetic thin-plate core 130, and the saturated part spreads as the external magnetic field becomes stronger. Then, as illustrated in FIG. 5C, in the area C where the external magnetic field is strong, the saturable magnetic thin-plate core 130 is completely saturated, with the result that inductance hardly changes even when the magnetic field strength changes.

Figure 6B:
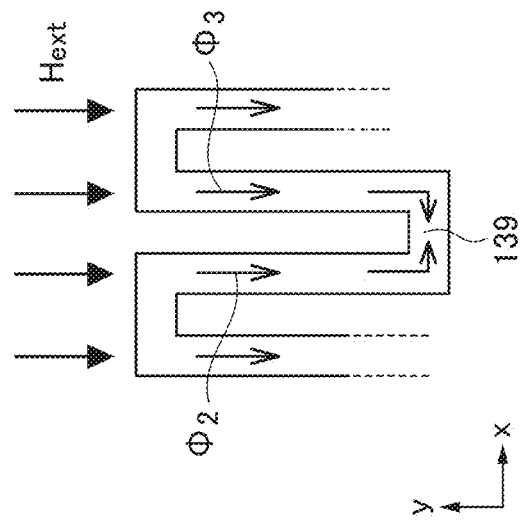
FIGS. 6A and 6B are views each explaining directivity of the saturable magnetic thin-plate core.
Figure 6A:
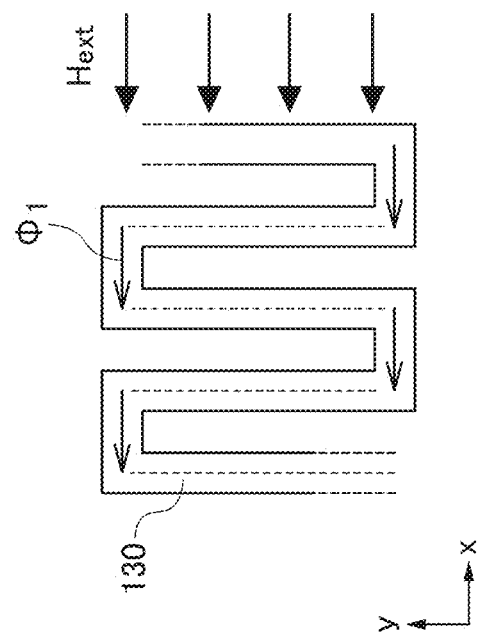

FIGS. 6A and 6B are views each explaining directivity of the saturable magnetic thin-plate core 130. FIG. 6A illustrates a case where the magnetic flux direction of the external magnetic field $H_{ext}$ is the x-direction, and FIG. 6B illustrates a case where the magnetic flux direction of the external magnetic field $H_{ext}$ is the y-direction.

As illustrated in FIG. 6A, when the magnetic flux direction of the external magnetic field $H_{ext}$ is the x-direction, a magnetic flux Φ1 is generated in the saturable magnetic thin-plate core 130. The magnetic flux Φ1 flows along the meander-shaped saturable magnetic thin-plate core 130. When viewed as a whole, the magnetic flux Φ1 flows inside the saturable magnetic thin-plate core 130 by a length corresponding to the length thereof in the x-direction. Thus, magnetic saturation is generated by the magnetic flux with the result that magnetic resistance is increased. The magnetic resistance is reversely proportional to inductance, so that an inductance value is reduced. On the other hand, when the magnetic flux direction of the external magnetic field $H_{ext}$ is the y-direction as illustrated in FIG. 6B, magnetic fluxes Φ2 and Φ3 are generated in the saturable magnetic thin-plate core 130. The magnetic fluxes Φ2 and Φ3 cancel each other at a portion 139 extending in the x-direction, so that the magnetic flux made to flow inside the saturable magnetic thin-plate core 130 by the external magnetic field $H_{ext}$ when viewed as a whole. Therefore, magnetic saturation is unlikely to occur, and a change in magnetic resistance is small, so that a change in an inductance value is also small. Thus, in the present embodiment, the saturable magnetic thin-plate core 130 has a meander shape, that is, extends in the x-direction while meandering in the y-direction, so that directivity with respect to the x-direction external magnetic field is enhanced.

Figure 7:
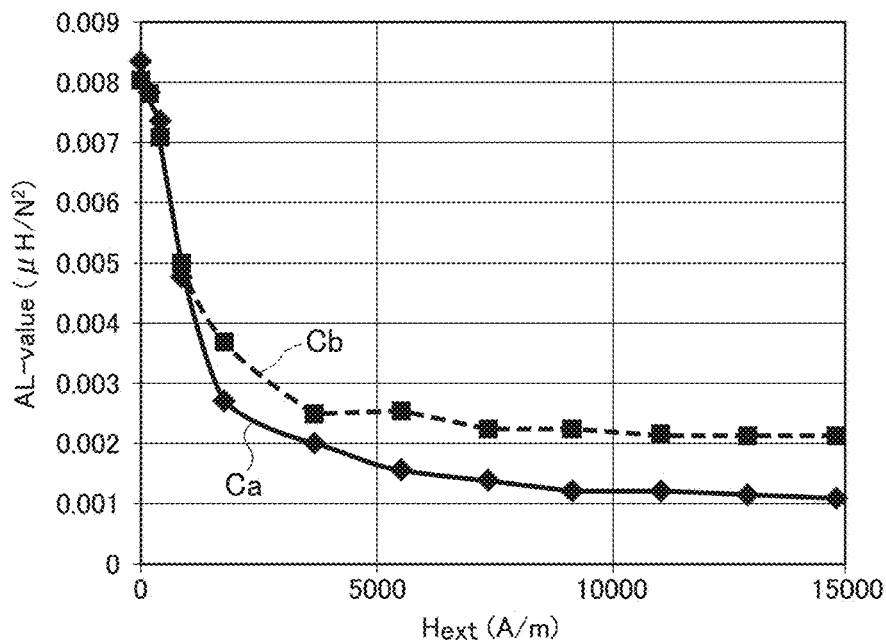
FIGS. 7 and 8 are graphs each explaining influence that the inner and outer diameters of the coil conductor have on magnetic characteristics.
Figure 8:
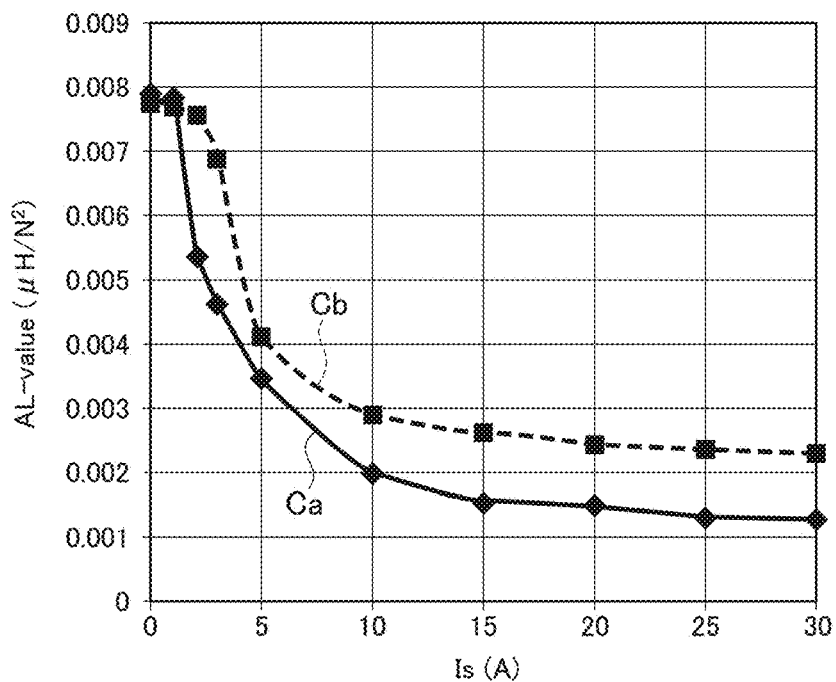

FIGS. 7 and 8 are graphs each explaining influence that the inner and outer diameters of the coil conductor 140 have on magnetic characteristics. FIG. 7 illustrates the relationship between the strength ($H_{ext}$) of the external magnetic field and inductance (AL-Value), and FIG. 8 illustrates the relationship between current ($I_s$) flowing through the coil conductor 140 and inductance (AL-Value).

Figure 9A:
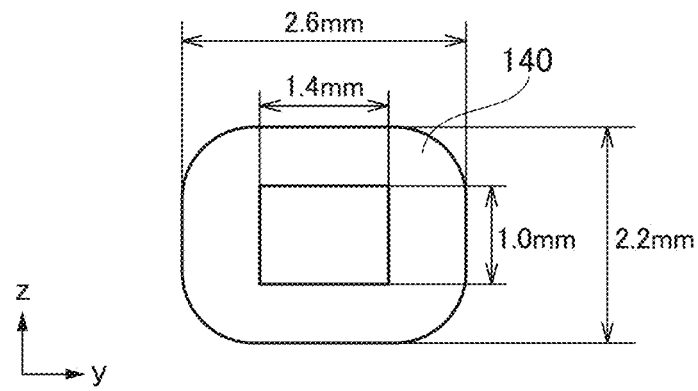
FIGS. 9A and 9B are views each explaining the inner and outer diameters of the coil conductor.
Figure 9B:
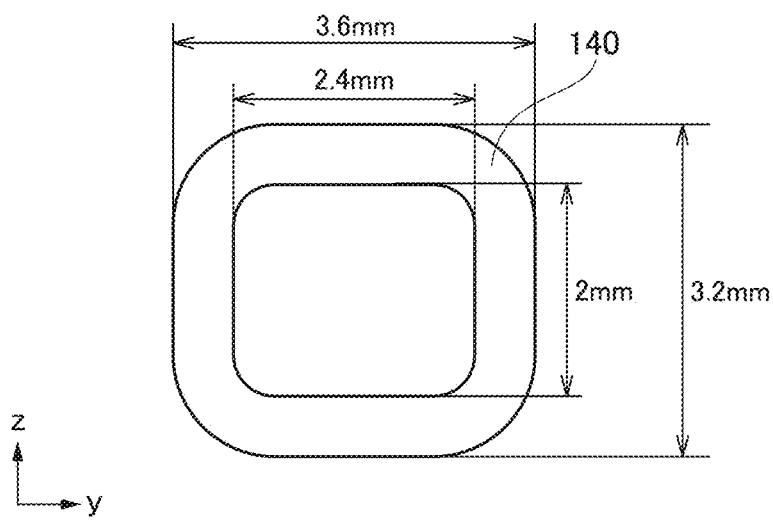

In both FIGS. 7 and 8, the curve Ca indicates a characteristic when the yz cross section of the coil conductor 140 has a size illustrated in FIG. 9A, and the curve Cb indicates a characteristic when the yz cross section of the coil conductor 140 has a size illustrated in FIG. 9B. The coil conductor 140 illustrated in FIG. 9A has an inner diameter of 1.4 mm×1.0 mm and an outer diameter of 2.6 mm×2.2 mm, and the coil conductor 140 illustrated in FIG. 9B has an inner diameter of 2.4 mm×2.0 mm and an outer diameter of 3.6 mm×3.2 mm.

As illustrated in FIG. 7, when current is made to flow through the coil conductor 140 to generate an external magnetic field, inductance is sufficiently reduced in the characteristic Ca, while inductance is not sufficiently reduced in the characteristic Cb due to increase in the hollow core effect. Further, as illustrated in FIG. 8, when current is made to flow through the coil conductor 140 so as to obtain predetermined inductance, more current $I_s$ is required in the characteristic Cb than in the characteristic Ca due to a larger distance between the coil conductor 140 and the saturable magnetic thin-plate core 130. In addition, as the inner and outer diameters of the coil conductor 140 become larger, the wire length becomes longer, so that not only a resistance component, but also the weight and cost are increased. When considering the above points, the coil conductor 140 is preferably wound as close as possible to the saturable magnetic thin-plate core 130.

In the inductance element 100A for a magnetic sensor according to the present embodiment, the first mounting area 111 of the first insulating substrate 110 is constricted in the y-direction and, thus, the inductance element 100A for a magnetic sensor has an H-like shape as a whole, so that the coil conductor 140 can be wound as close as possible to the first section 131 of the saturable magnetic thin-plate core 130, whereby satisfactory characteristics can be obtained.

As described above, in the inductance element 100A for a magnetic sensor according to the present embodiment, the saturable magnetic thin-plate core 130 has the meander-shaped second and third sections 132 and 133, so that it is possible to increase the effective magnetic path while suppressing increase in the size of an element in the x-direction. In addition, the coil conductor 140 is wound around the linear-shaped first section 131, and the yz cross section of the base body is reduced at this portion, so that the distance between the coil conductor 140 and the saturable magnetic thin-plate core 130 can be reduced. With the above configuration, the inductance element 100A for a magnetic sensor according to the present embodiment can be reduced in size and increased in detection sensitivity.

Second Embodiment

Figure 10A:
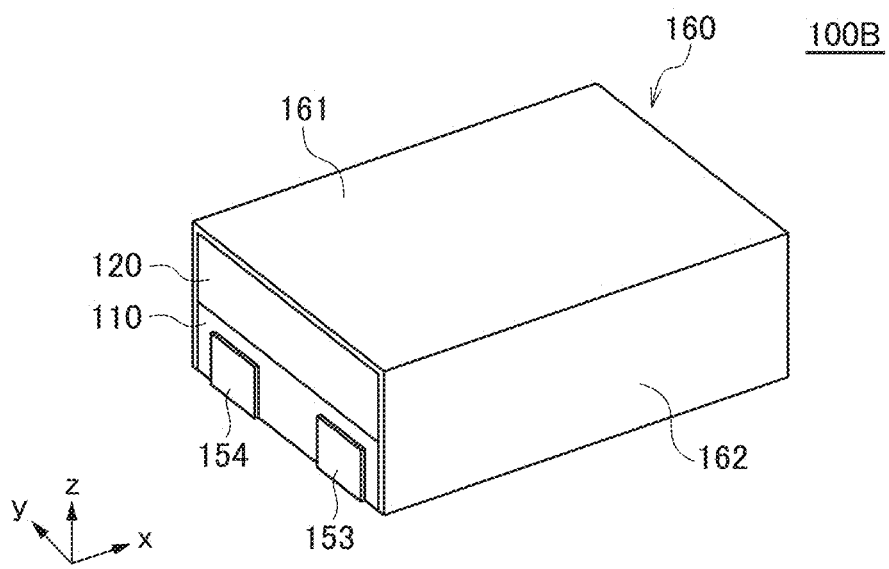
FIGS. 10A and 10B are views each illustrating the outer appearance of an inductance element for a magnetic sensor according to a second embodiment of the present invention, where
Figure 10B:
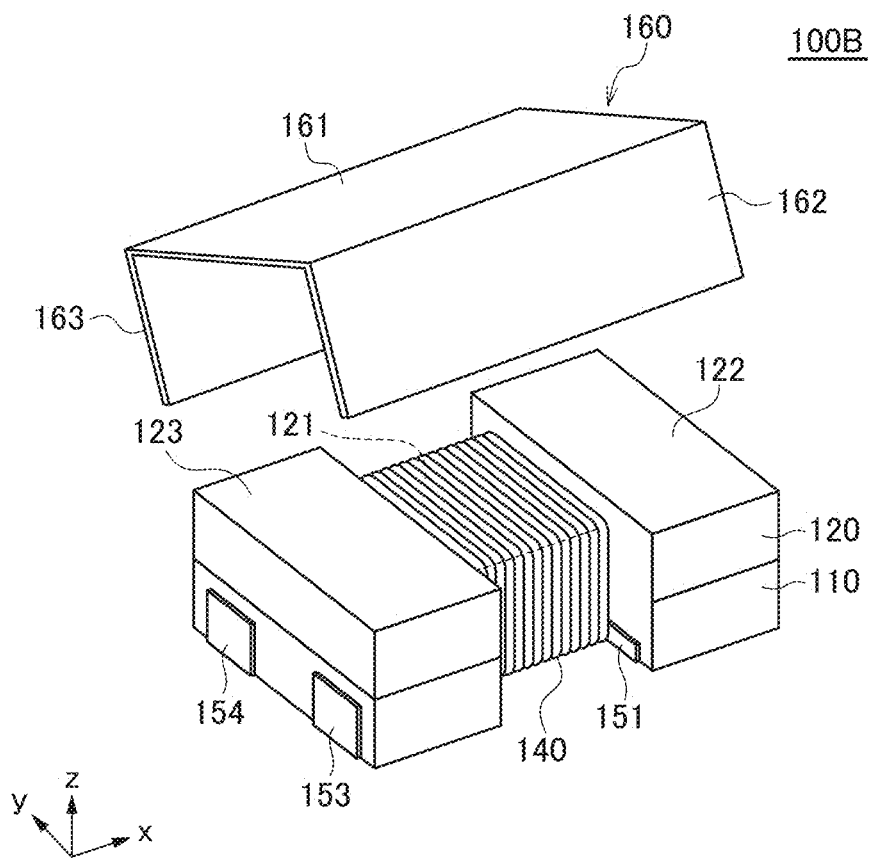

FIGS. 10A and 10B are views each illustrating the outer appearance of an inductance element 100B for a magnetic sensor according to the second embodiment of the present invention. FIG. 10A is a schematic perspective view, and FIG. 10B is an exploded perspective view.

As illustrated in FIGS. 10A and 10B, the inductance element for a magnetic sensor 100B according to the present embodiment differs from the inductance element for a magnetic sensor 100A according to the first embodiment in that it has a magnetic shield 160 and that the heights in the z-direction of flange-shaped areas 122 and 123 positioned at both ends of the second insulating substrate 120 in the x-direction are set higher than the height in the z-direction of a center area 121 in order to prevent interference between the magnetic shield 160 and the coil conductor 140. Other configurations are the same as those of the inductance element for a magnetic sensor 100A according to the first embodiment, so the same reference numerals are given to the same elements, and overlapping description will be omitted.

The magnetic shield 160 is made of a soft magnetic material such as permalloy and has a top surface 161 defining the xy plane and two side surfaces 162 and 163 each defining the xz plane. The top surface 161 covers the base body constituted of the first and second insulating substrates 110 and 120 from the z-direction, and the two side surfaces 162 and 163 cover the base body from the y-direction. On the other hand, both sides of the base body in the x-direction are not covered with the magnetic shield 160, but opened. The magnetic shield 160 are fixed to the second and third mounting areas 112 and 113 of the first insulating substrate 110 or to the flange-shaped areas 122 and 123 of the second insulating substrate 120 so as not to interfere with the coil conductor 140.

The magnetic shield 160 plays a role of enhancing directivity by detouring magnetic flux acting as noise. In the present embodiment, the magnetic flux acting as noise is magnetic flux in the y-direction. The magnetic flux in the y-direction is detoured to the magnetic shield 160 without passing the saturable magnetic thin-plate core 130, whereby directivity with respect to magnetic flux in the x-direction to be detected can be enhanced.

Third Embodiment

Figure 11:
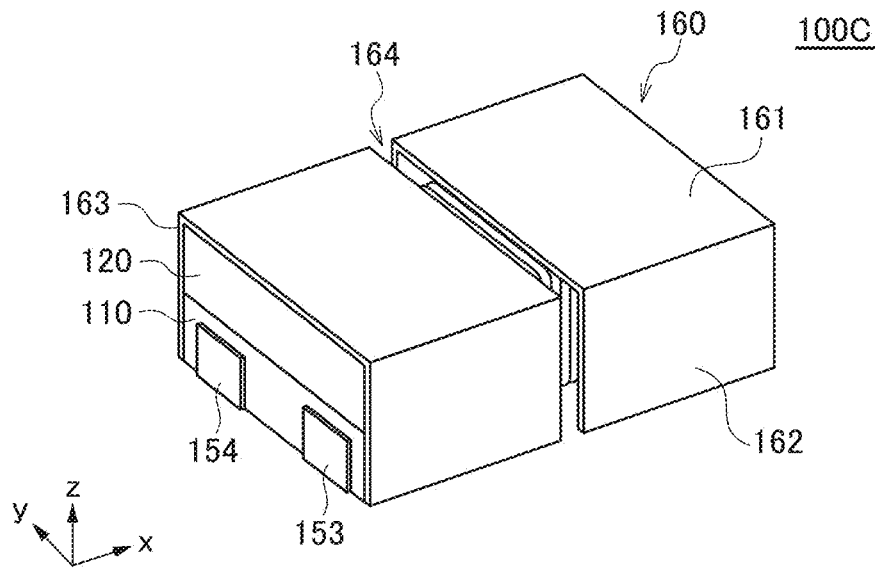
FIG. 11 is a schematic perspective view illustrating the outer appearance of an inductance element for a magnetic sensor according to a third embodiment of the present invention.

FIG. 11 is a schematic perspective view illustrating the outer appearance of an inductance element for a magnetic sensor 100C according to the third embodiment of the present invention.

As illustrated in FIG. 11, the inductance element for a magnetic sensor 100C according to the present embodiment differs from the inductance element for a magnetic sensor 100B according to the second embodiment in that a slit 164 is formed in the magnetic shield 160. Other configurations are the same as those of the inductance element for a magnetic sensor 100B according to the second embodiment, so the same reference numerals are given to the same elements, and overlapping description will be omitted.

The slit 164 extends in the y-direction in the top surface 161 and extends in the z-direction in the side surfaces 162 and 163 so as to segment the magnetic shield 160 in the x-direction. The slit 164 thus formed in the magnetic shield 160 functions as a gap serving as magnetic resistance against magnetic flux in the x-direction, thereby making it possible to prevent deterioration in detection sensitivity due to detouring of the magnetic flux in the x-direction to be detected to the magnetic shield 160.

Fourth Embodiment

Figure 12:
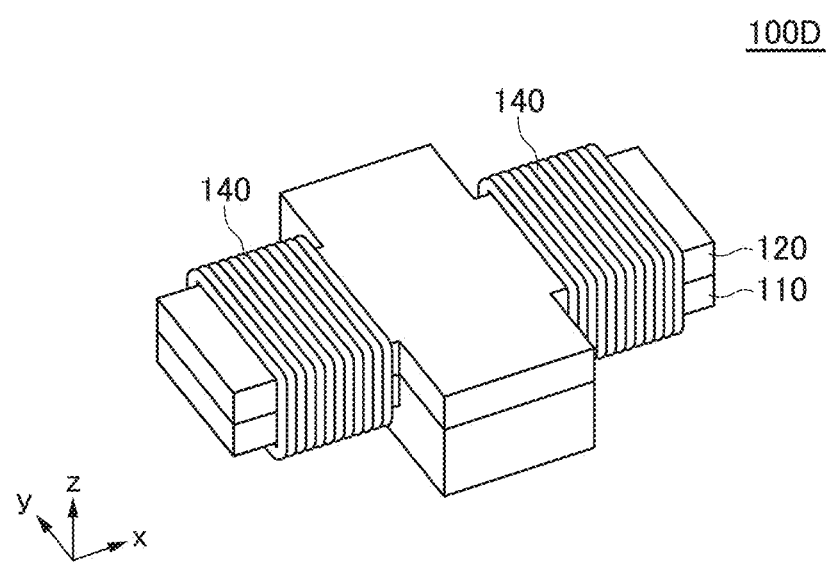
FIG. 12 is a schematic perspective view illustrating the outer appearance of an inductance element for a magnetic sensor according to a fourth embodiment of the present invention.
Figure 13:
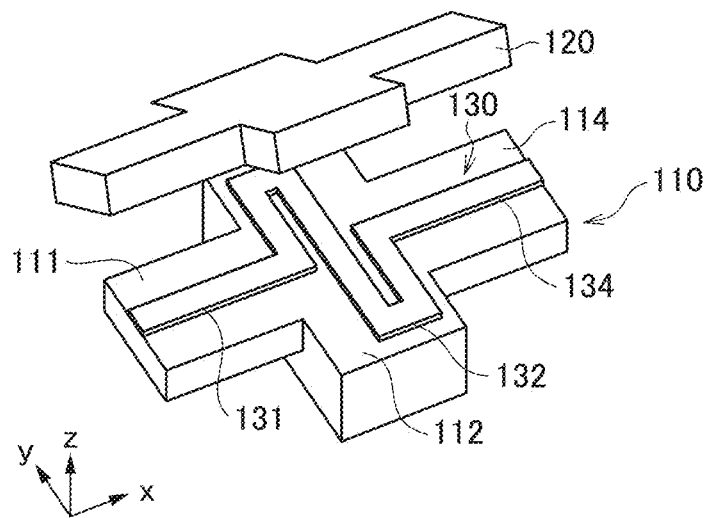
FIG. 13 is an exploded perspective view of the inductance element for a magnetic sensor shown in FIG. 12.

FIG. 12 is a schematic perspective view illustrating the outer appearance of an inductance element for a magnetic sensor 100D according to the fourth embodiment of the present invention. FIG. 13 is an exploded perspective view of the inductance element for a magnetic sensor 100D. In FIG. 13, illustration of the coil conductor 140 is omitted.

As illustrated in FIGS. 12 and 13, in the inductance element for a magnetic sensor 100D according to the fourth embodiment, the planar shape of each of the first and second insulating substrates 110 and 120 is a substantially cross shape. That is, the first insulating substrate 110 has a second mounting area 112 positioned at the center in the x-direction and first and fourth mounting areas 111 and 114 positioned at both sides of the second mounting area 112 in the x-direction. The second mounting area 112 is larger in width in the y-direction and in thickness in the z-direction than the first and fourth mounting areas 111 and 114. The second insulating substrate 120 has the same planar shape (shape in the xy plane) as that of the first insulating substrate 110.

The saturable magnetic thin-plate core 130 has a first section 131 formed on the first mounting area 111, a second section 132 formed on the second mounting area 112, and a fourth section 134 formed on the fourth mounting area 114. The first and fourth sections 131 and 134 linearly extend in the x-direction. One end of the second section 132 is connected to one end of the first section 131, and the other end thereof is connected to one end of the fourth section 134.

The coil conductor 140 is wound around the first and fourth mounting areas 111 and 114 in a state where the first and second insulating substrates 110 and 120 are put one over the other. That is, the coil conductor 140 is wound around the first and fourth sections 131 and 134 of the saturable magnetic thin-plate core 130.

As exemplified in the present embodiment, the saturable magnetic thin-plate core 130 may have a plurality of linear sections and may have only one meander-shaped section.

Figure 14:
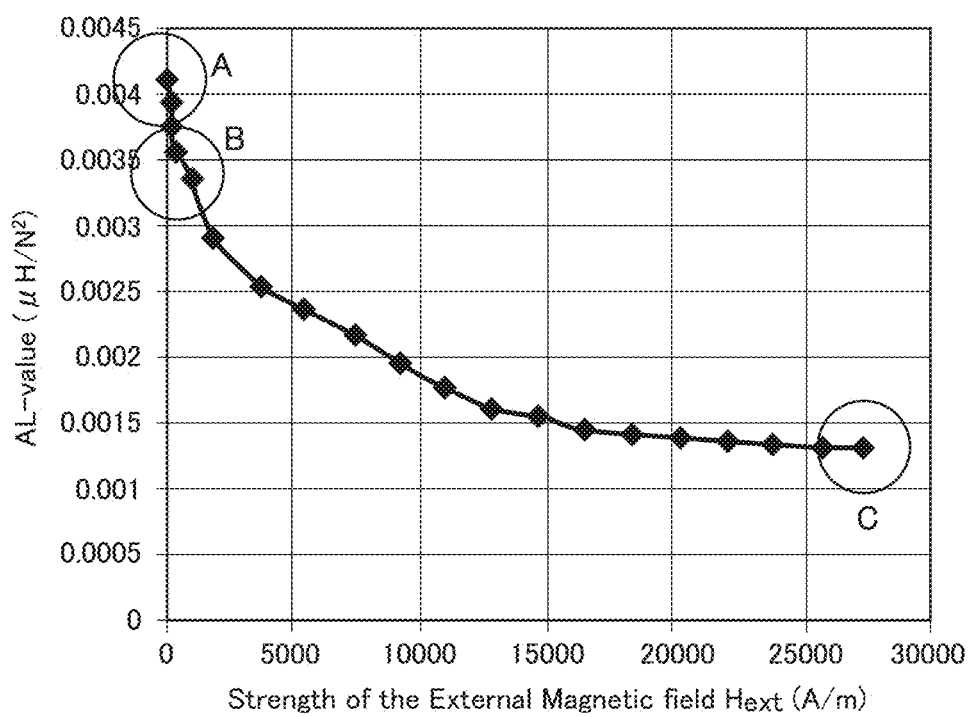
FIG. 14 is a graph illustrating the magnetic characteristics of the inductance element for a magnetic sensor shown in FIG. 12.
Figure 15C:
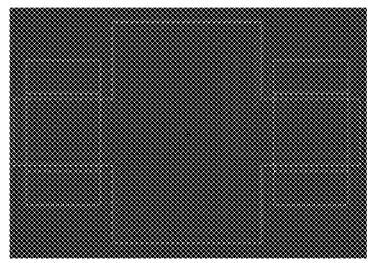
FIGS. 15A to 15C are views illustrating specific permeability distributions of the saturable magnetic thin-plate core in the areas A to C of FIG. 14, respectively.
Figure 15B:
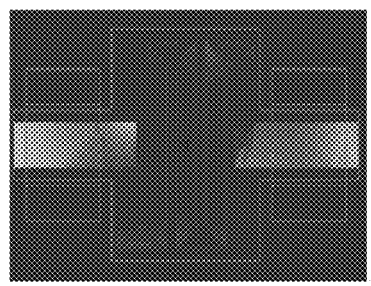
Figure 15A:
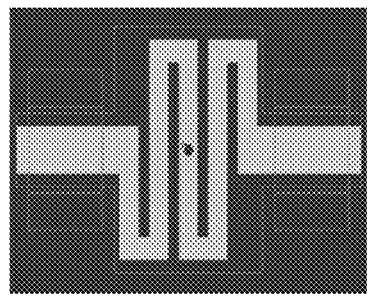

FIG. 14 is a graph illustrating the magnetic characteristics of the inductance element for a magnetic sensor 100D according to the present embodiment. FIGS. 15A to 15C are views illustrating specific permeability distributions of the saturable magnetic thin-plate core 130 in the areas A to C of FIG. 14, respectively. In FIGS. 15A to 15C, a brighter part has a higher specific permeability, and a darker part has a lower specific permeability.

As illustrated in FIG. 15A, in the area A where the external magnetic field is weak, the saturable magnetic thin-plate core 130 is not saturated and thus has a sufficiently high specific permeability as a whole. As illustrated in FIG. 15B, in the area B where the external magnetic field is at an intermediate level, saturation starts from the second section 132 of the saturable magnetic thin-plate core 130, and the saturated part spreads as the external magnetic field becomes stronger. Then, as illustrated in FIG. 15C, in the area C where the external magnetic field is strong, the saturable magnetic thin-plate core 130 is completely saturated, with the result that inductance hardly changes even when the magnetic field strength changes.

The magnetic shield 160 may be used also in the inductance element for a magnetic sensor 100D according to the present embodiment. In this case, the magnetic shield 160 may entirely cover the base body constituted of the first and second insulating substrates 110 and 120 from the y- and z-directions or may selectively cover only the center portion of the base body where the yz-plane is enlarged, i.e., the meander-shaped second section 132. Further, the slit 164 may be formed in the magnetic shield 160.

Fifth Embodiment

Figure 16:
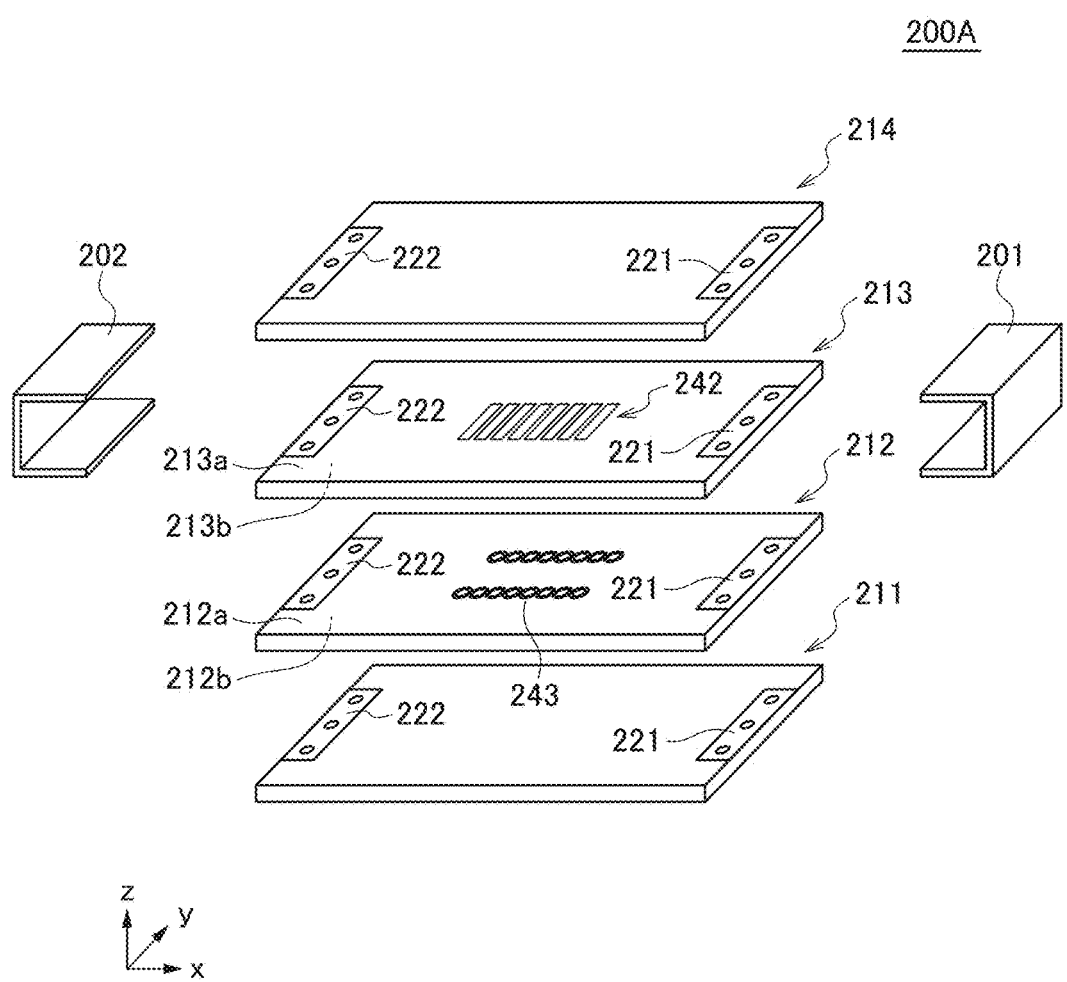
FIG. 16 is a schematic perspective view illustrating the configuration of an inductance element for a magnetic sensor according to a fifth embodiment of the present invention.

FIG. 16 is a schematic perspective view illustrating the configuration of an inductance element for a magnetic sensor 200A according to a fifth embodiment of the present invention.

As illustrated in FIG. 16, the inductance element for a magnetic sensor 200A according to the present embodiment has a base body constituted of a plurality of laminated insulating substrates 211 to 214 and terminal electrodes 201 and 202 provided at both ends of the base body in the x-direction. The insulating substrates 211 to 214 are each a flat plate-like substrate with its xy plane as the main surface and are laminated in the z-direction to constitute the base body. As the material of the insulating substrates 211 to 214, a ceramic-based insulating material such as LTCC, a monocrystalline or polycrystalline insulating material such as alumina, magnesium oxide, or lanthanum aluminate, a resin-based insulating material such as glass epoxy, etc. may be used.

A conductor pattern 221 is formed at one end portion of each of the insulating substrates 211 to 214 in the x-direction. These conductor patterns 221 are connected to one another through through hole conductors and connected in common to the terminal electrode 201. Similarly, a conductor pattern 222 is formed at the other end portion of each of the insulating substrates 211 to 214 in the x-direction. These conductor patterns 222 are connected to one another through through hole conductors and connected in common to the terminal electrode 202.

Figure 17:
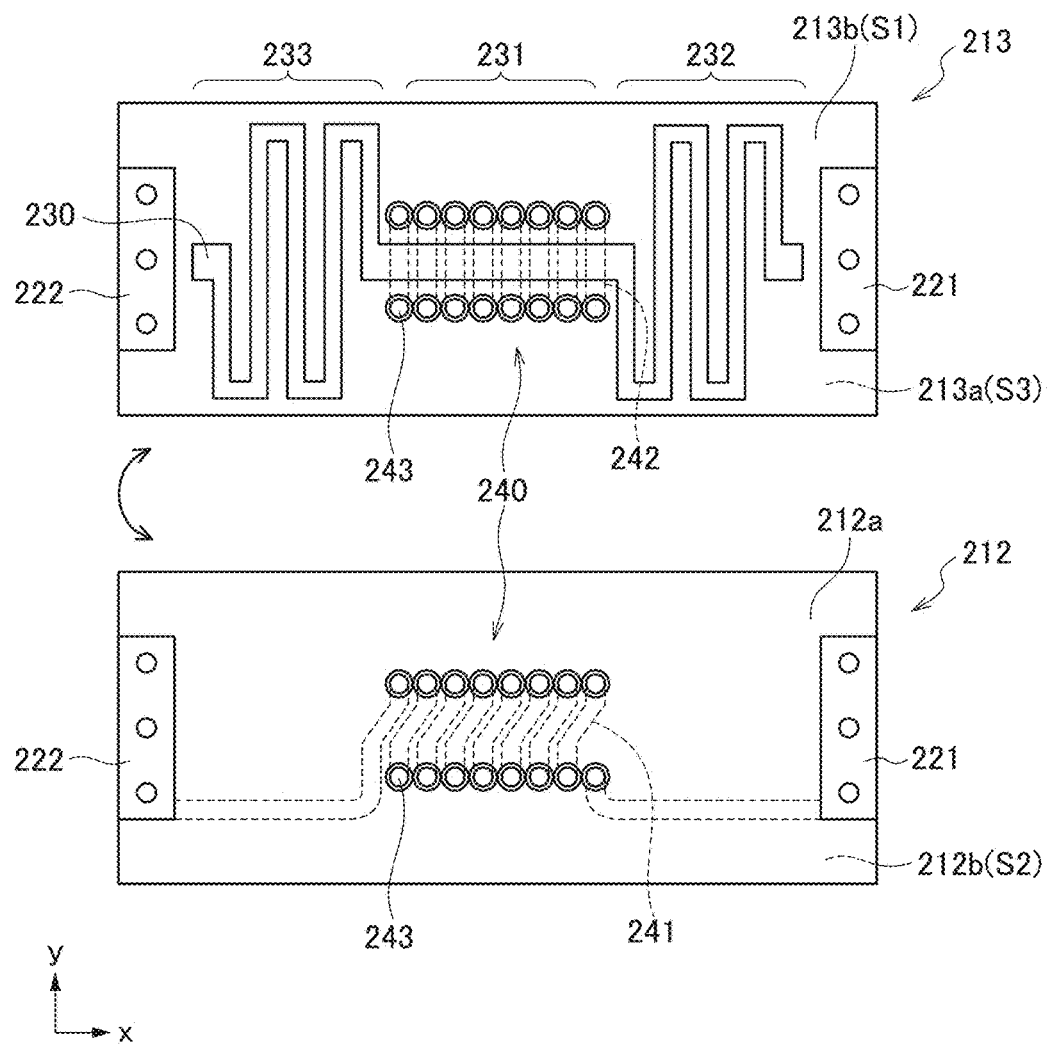
FIG. 17 is a plan view for explaining pattern structures formed on the insulating substrates, respectively.

FIG. 17 is a plan view for explaining pattern structures formed on the insulating substrates 212 and 213, respectively. In FIG. 17, the insulating substrate 212 is viewed from an upper surface 212a side thereof, and the insulating substrate 213 is viewed from a lower surface 213b side thereof.

As illustrated in FIG. 17, the lower surface 213b of the insulating substrate 213 constitutes a first surface S1 on which a saturable magnetic thin-plate core 230 is formed. Like the above-described saturable magnetic thin-plate core 130, a Fe/Co amorphous magnetic metal is preferably used as the material of the saturable magnetic thin-plate core 230. The saturable magnetic thin-plate core 230 has a first section 231 extending linearly in the x-direction and second and third sections 232 and 233 each extending in a meander shape. One end of the first section 231 is connected to one end of the second section 232, and the other end thereof is connected to one end of the third section 233. The other ends of the respective second and third sections 232 and 233 are opened in the x-direction. In the example of FIG. 17, each of the second and third sections 232 and 233 has five folded-back portions folded back in the y-direction, but not limited thereto.

The lower surface 212b of the insulating substrate 212 and the upper surface 213a of the insulating substrate 213 constitute second and third surfaces S2 and S3, respectively, on which conductor patterns constituting a coil conductor 240 are formed. On the upper surface 213a of the insulating substrate 213 constituting the third surface S3, a plurality of planar conductor patterns 242 extending in the y-direction are formed so as to overlap the first section 231 of the saturable magnetic thin-plate core 230 in a plan view (when viewed in the illustrated z-direction which is the lamination direction). On the lower surface 212b of the insulating substrate 212 constituting the second surface S2, a plurality of planar conductor patterns 241 are formed so as to overlap the first section 231 of the saturable magnetic thin-plate core 230 in a plan view. Both ends of each of the planar conductor patterns 241 in the y-direction are shifted by one pitch in the x-direction so as to overlap end portions of different planar conductor patterns 242 formed on the third surface S3.

The end portions of each of the planar conductor patterns 241 and the end portions of the planar conductor patterns 242 which overlap each other in a plan view are connected to each other through through hole conductors 243 formed so as to penetrate the insulating substrates 212 and 213. With this configuration, the planar conductor patterns 241 and 242 and through hole conductors 243 constitute a coil pattern wound around the first section 231 of the saturable magnetic thin-plate core 230. Both ends of the coil pattern are connected to the terminal electrodes 201 and 202, respectively, through the conductor patterns 221 and 222.

As described above, in the inductance element for a magnetic sensor 200A according to the present embodiment, the plurality of laminated insulating substrates 211 to 214 are used, and the saturable magnetic thin-plate core 230 and the coil conductor 240 are formed on the three surfaces S1 to S3 included in the insulating substrates 211 to 214. The coil conductor 240 is wound around the first section 231 of the saturable magnetic thin-plate core 230, so that when current is made to flow through the coil conductor 240, an external magnetic field can be applied to the first section 231 of the saturable magnetic thin-plate core 230. The saturable magnetic thin-plate core 230 has the second and third sections 232 and 233 extending in a meander shape, so that it is possible to increase the effective magnetic path of the saturable magnetic thin-plate core 230 while suppressing increase in the size of an element in the x-direction. Although the insulating substrates 211 and 214 positioned at the respective lowermost and uppermost layers have no elements constituting the saturable magnetic thin-plate core 230 and coil conductor 240, they play a role of protecting the second and third surfaces S2 and S3.

Figure 18:
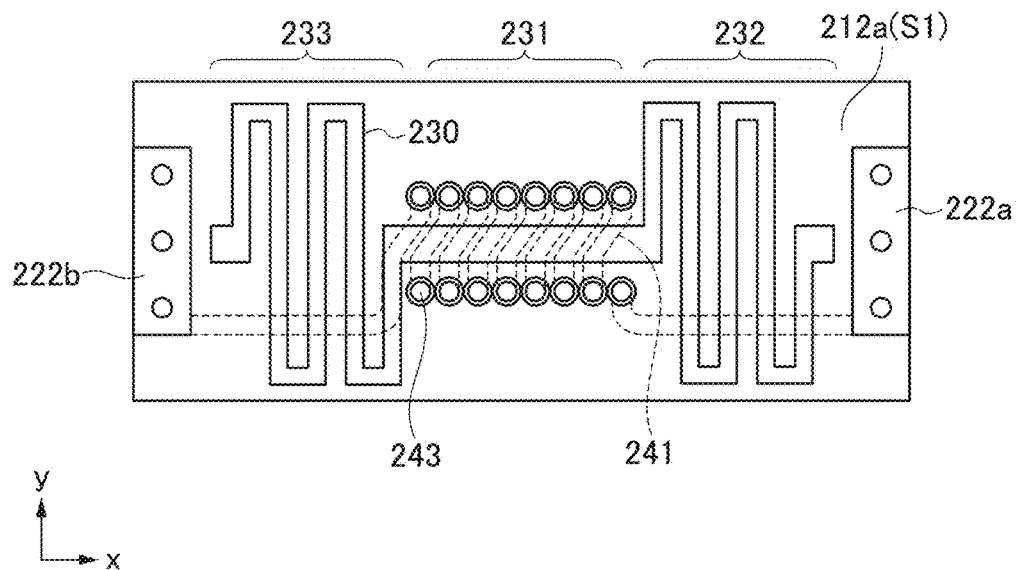
FIG. 18 is a plan view for explaining another pattern structures formed on the insulating substrate.

In the example of FIG. 17, the saturable magnetic thin-plate core 230 is formed on the lower surface 213b of the insulating substrate 213; however, in place of or in addition to this, the saturable magnetic thin-plate core 230 may be formed on the upper surface 212a of the insulating substrate 212 as illustrated in FIG. 18. The position and shape of the saturable magnetic thin-plate core 230 to be formed on the upper surface 212a of the insulating substrate 212 need to be designed correctly so that it completely overlaps the saturable magnetic thin-plate core 230 formed on the lower surface 213b of the insulating substrate 213 in a plan view. As described above, the surface S1 on which the saturable magnetic thin-plate core 230 is formed only needs to be positioned between the insulating substrates 212 and 213 and may be positioned on any one of opposite sides (or on both the sides) of the insulating substrates 212 and 213. When the saturable magnetic thin-plate core 230 is formed on both the lower surface 213b of the insulating substrate 213 and the upper surface 212a of the insulating substrate 212, the thickness of the saturable magnetic thin-plate core 230 can be doubled.

Similarly, the planar conductor patterns 241 constituting a part of the coil conductor 240 may be formed on the upper surface 211a of the insulating substrate 211 in place of the lower surface 212b of the insulating substrate 212. That is, the second surface S2 on which the planar conductor pattern 241 is formed only needs to be positioned between the insulating substrates 211 and 212 and may be positioned on any one of opposite sides of the insulating substrates 211 and 212. Further, the planar conductor patterns 242 constituting another part of the coil conductor 240 may be formed on the lower surface 214b of the insulating substrate 214 in place of the upper surface 213a of the insulating substrate 213. That is, the third surface S3 on which the planar conductor pattern 242 is formed only needs to be positioned between the insulating substrates 213 and 214 and may be positioned on any one of opposite sides of the insulating substrates 213 and 214.

Figure 19:
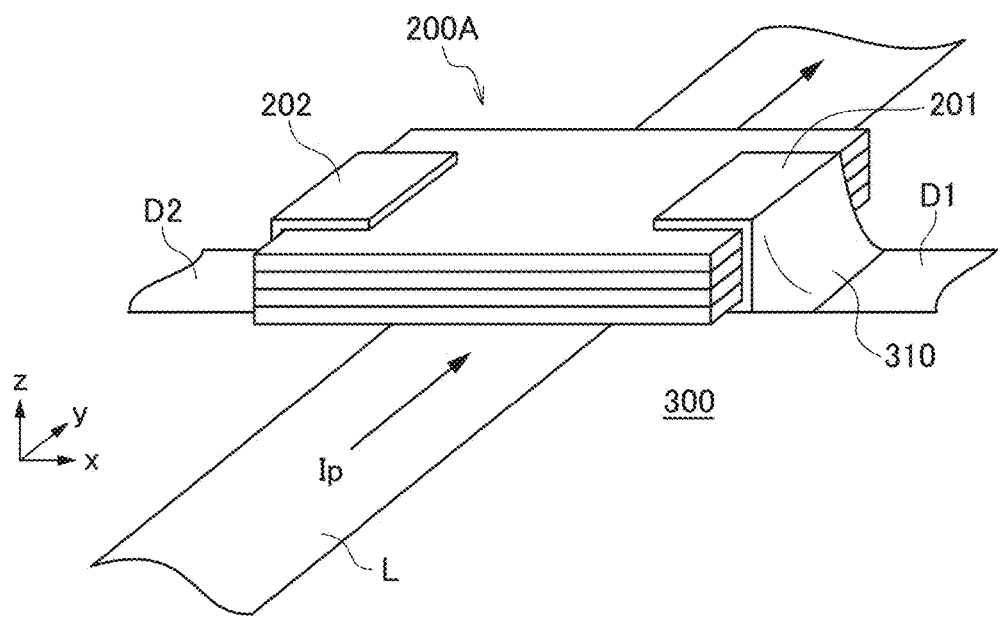
FIG. 19 is a schematic perspective view illustrating a state where the inductance element for a magnetic sensor shown in FIG. 16 is mounted on a circuit board.

FIG. 19 is a schematic perspective view illustrating a state where the inductance element for a magnetic sensor 200A according to the present embodiment is mounted on a printed circuit board 300.

In the example of FIG. 19, a wiring pattern L extending in the y-direction is formed on the printed circuit board 300, and the inductance element for a magnetic sensor 200A is mounted so as to cross the wiring pattern L. A current Ip to be measured flows through the wiring pattern L. Further, wiring patterns D1 and D2 are formed on the printed circuit board 300. The wiring patterns D1 and D2 are connected respectively to the terminal electrodes 201 and 202 of the inductance element for a magnetic sensor 200A through solders 310.

Thus, when the current Ip to be measured flows through the wiring pattern L, inductance of the saturable magnetic thin-plate core 230 changes according to the strength of the magnetic field generated by the current flow, so that it is possible to measure the amount of the current Ip to be measured by detecting a change in the inductance through the coil conductor 240.

Figure 20:
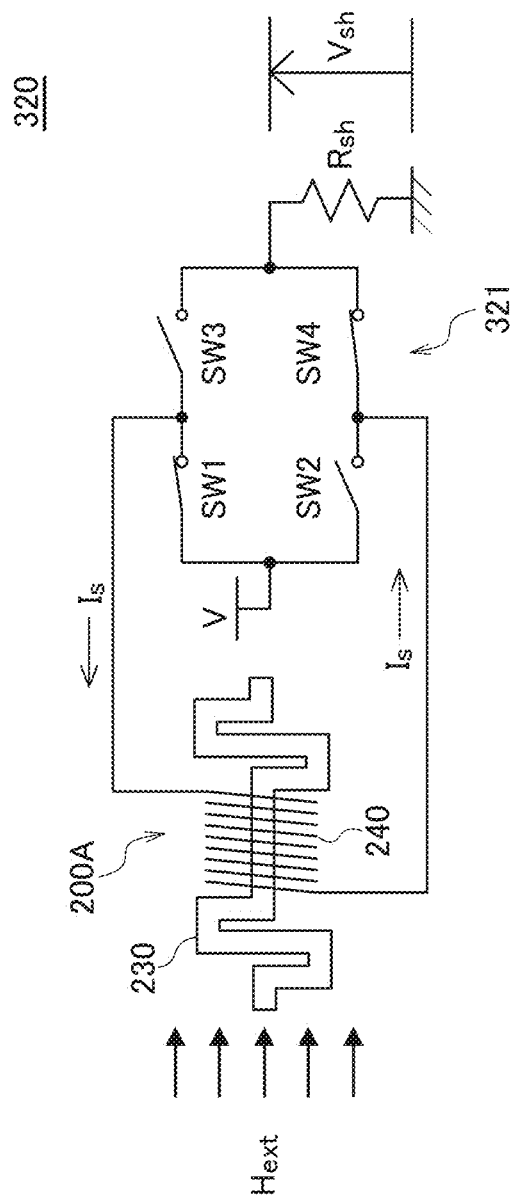
FIG. 20 is a circuit diagram of a magnetic sensor provided with the inductance element shown in FIG. 16.

FIG. 20 is a circuit diagram of a magnetic sensor 320 provided with the inductance element 200A.

The magnetic sensor 320 illustrated in FIG. 20 includes the inductance element 200A and a detection circuit 321. The detection circuit 321 includes a bridge circuit constituted of switches SW1 to SW4. By controlling these switches SW1 to SW4, a current $I_s$ to be detected is made to flow through the coil conductor 240. The switches SW1 to SW4 are alternately turned ON and OFF, whereby an accumulation period during which magnetic energy is accumulated in the inductance element 200A and a discharge period during which the magnetic energy accumulated in the inductance element 200A is discharged are alternately repeated.

The current $I_s$ flowing through the coil conductor 240 depends on the strength of the external magnetic field $H_{ext}$. The current $I_s$ to be detected is converted into a voltage $V_{sh}$ to be detected by a resistor $R_{sh}$, so that it is possible to detect the strength of the external magnetic field $H_{ext}$ by detecting the voltage $V_{sh}$ to be detected. Thus, it is possible to measure the amount of the current Ip to be measured flowing through the wiring pattern L by mounting the inductance element 200A such that it crosses the wiring pattern L.

Sixth Embodiment

Figure 21:
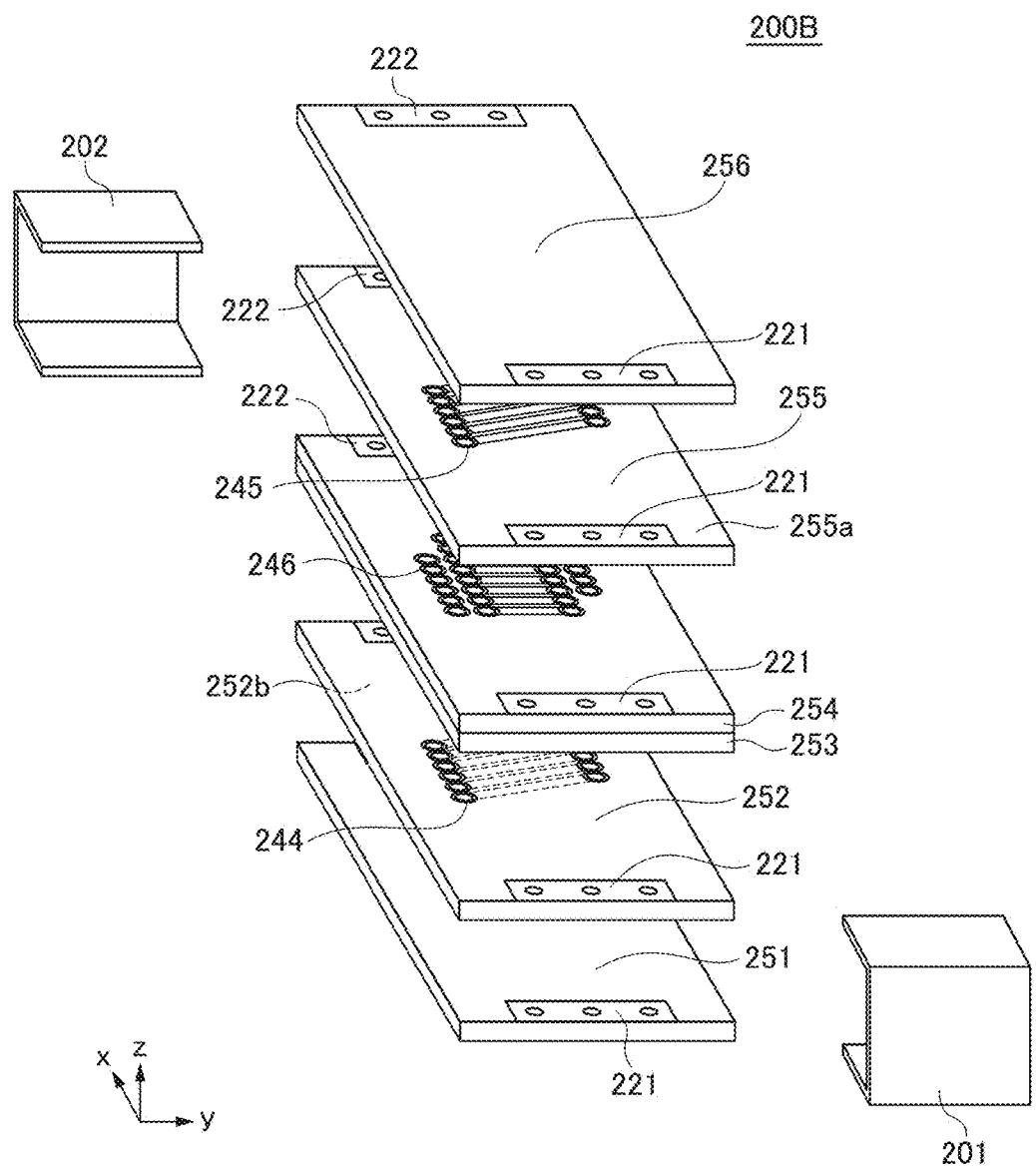
FIG. 21 is a schematic perspective view illustrating the configuration of an inductance element for a magnetic sensor according to a sixth embodiment of the present invention.

FIG. 21 is a schematic perspective view illustrating the configuration of an inductance element for a magnetic sensor 200B according to the sixth embodiment of the present invention.

As illustrated in FIG. 21, the inductance element for a magnetic sensor 200B according to the present embodiment has a base body constituted of a plurality of laminated insulating substrates 251 to 256 and terminal electrodes 201 and 202 provided at both ends of the base body in the x-direction. A conductor pattern 221 is formed at one end portion of each of the insulating substrates 251 to 256 in the x-direction. These conductor patterns 221 are connected to one another through through hole conductors and connected in common to the terminal electrode 201. Similarly, a conductor pattern 222 is formed at the other end portion of each of the insulating substrates 251 to 256 in the x-direction. These conductor patterns 222 are connected to one another through through hole conductors and connected in common to the terminal electrode 202. As described above, in the present embodiment, the base body is constituted of six laminated insulating substrates 251 to 256.

A planar conductor pattern 244 constituting a part of the coil conductor 240 is formed on a lower surface 252b of the insulating substrate 252. A planar conductor pattern 245 constituting a part of the coil conductor 240 is formed on an upper surface 255a of the insulating substrate 255.

Figure 22:
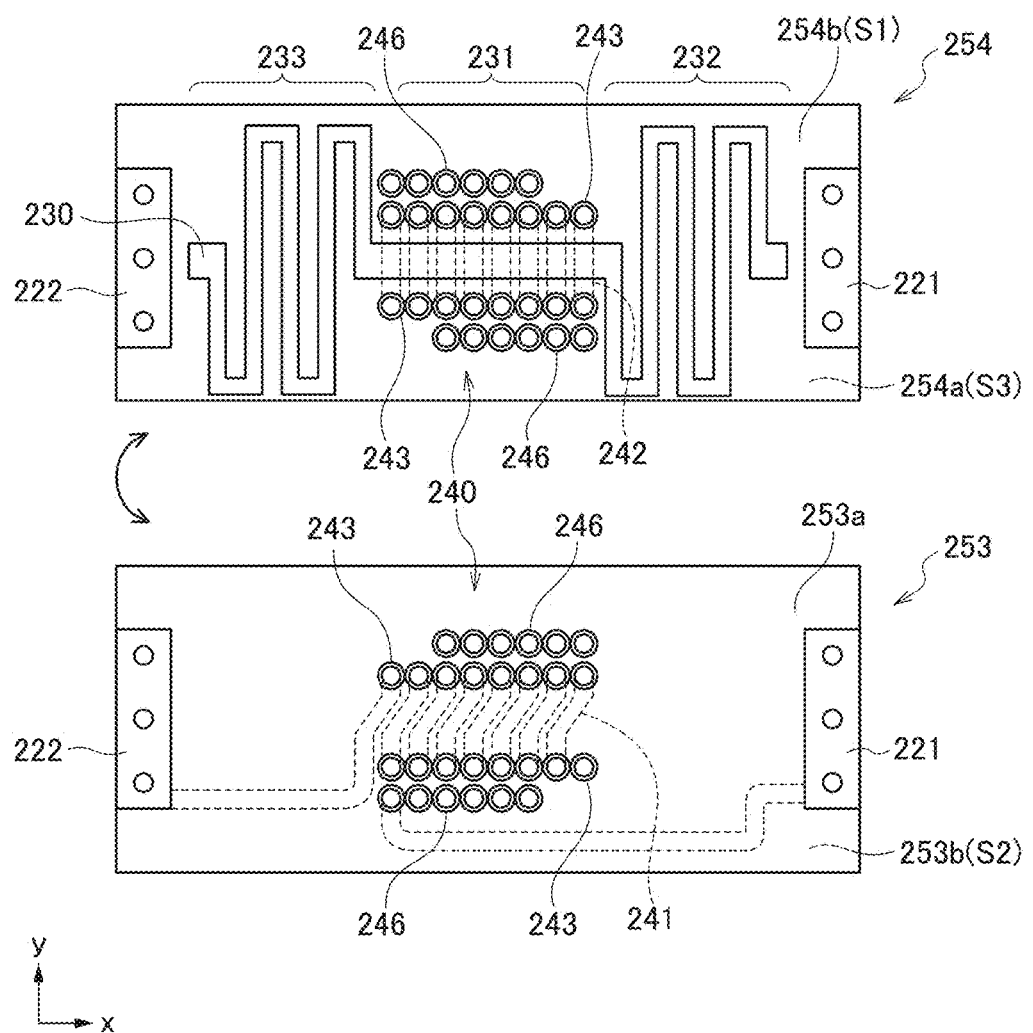
FIG. 22 is a plan view for explaining pattern structures formed on the insulating substrates, respectively.

FIG. 22 is a plan view for explaining pattern structures formed on the insulating substrates 253 and 254, respectively. In FIG. 22, the insulating substrate 253 is viewed from an upper surface 253a side thereof, and the insulating substrate 254 is viewed from a lower surface 254b side thereof.

The insulating substrates 253 and 254 in the present embodiment correspond respectively to the insulating substrates 212 and 213 in the inductance element for a magnetic sensor 200A according to the fifth embodiment. That is, the lower surface 254b of the insulating substrate 254 constitutes the first surface S1 on which the saturable magnetic thin-plate core 230 is formed. The lower surface 253b of the insulating substrate 253 and the upper surface 254a of the insulating substrate 254 constitute the second and third surfaces S2 and S3, respectively, on which the planar conductor patterns 241 and 242 constituting the coil conductor 240 are formed. The planar conductor patterns 241 and 242 are connected to each other through the through hole conductors 243 formed so as to penetrate the insulating substrates 253 and 254.

Further, in the present embodiment, the planar conductor pattern 244 is formed on the lower surface 252b of the insulating substrate 252, and the planar conductor pattern 245 is formed on the upper surface 255a of the insulating substrate 255. The planar conductor patterns 244 and 245 are disposed so as to overlap the first section 231 of the saturable magnetic thin-plate core 230 in a plan view (when viewed in the z-direction which is the lamination direction), and end portions of each of the planar conductor patterns 244 and end portions of the planar conductor patterns 245 which overlap each other in a plan view are connected to each other through through hole conductors 246 formed so as to penetrate the insulating substrates 252 to 255. With this configuration, the planar conductor patterns 244 and 245 and through hole conductors 246 constitute a second coil pattern wound around the first section 231 of the saturable magnetic thin-plate core 230. The first coil pattern constituted of the planar conductor patterns 241 and 242 and through hole conductors 243 and the second coil pattern constituted of the planar conductor patterns 244 and 245 and through hole conductors 246 are connected in series to the terminal electrodes 201 and 202 through the conductor patterns 221 and 222.

With this configuration, in the inductance element for a magnetic sensor 200B according to the present embodiment, the number of turns of the coil conductor 240 wound around the first section 231 of the saturable magnetic thin-plate core 230 can be increased. Other configurations are the same as those of the inductance element for a magnetic sensor 200A according to the fifth embodiment.

Seventh Embodiment

Figure 23:
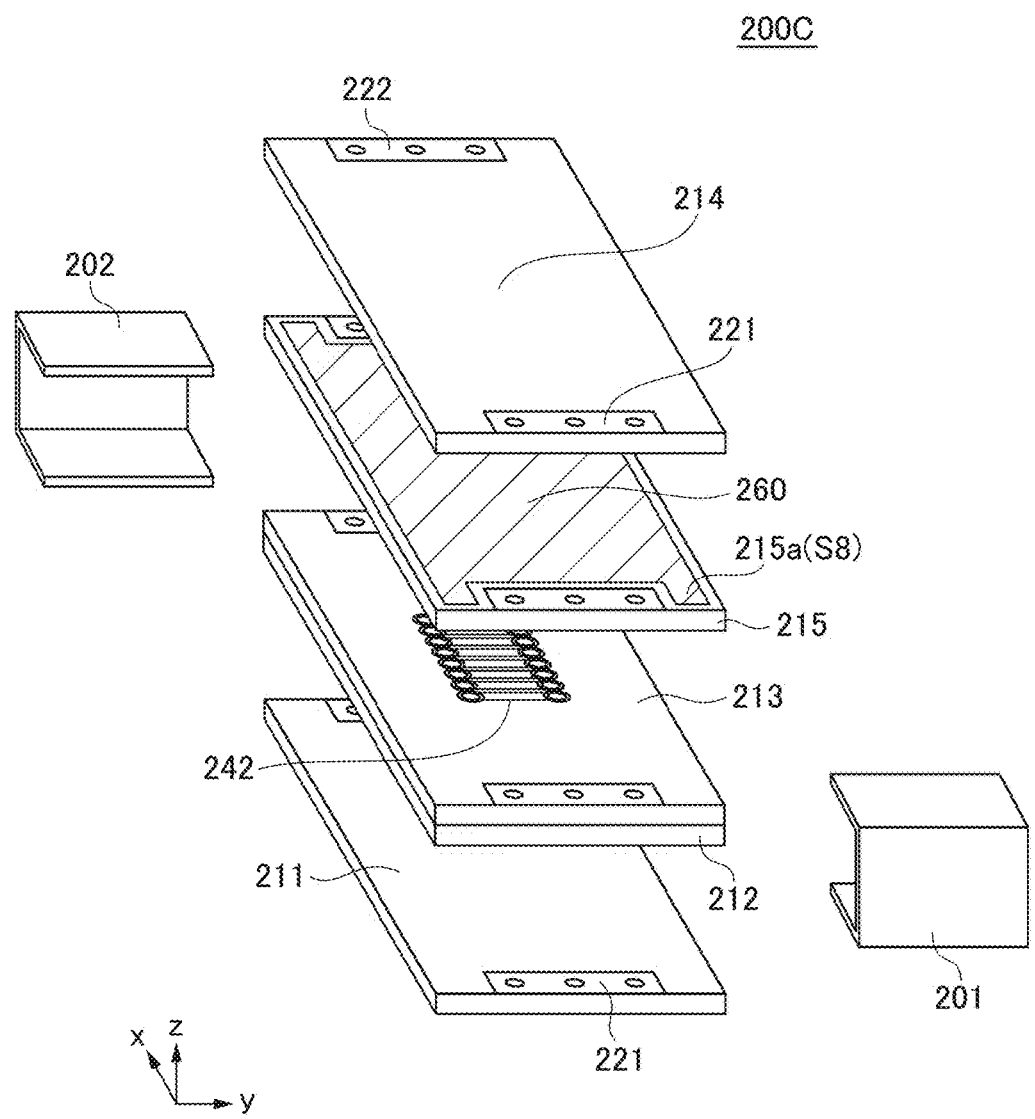
FIG. 23 is a schematic exploded perspective view illustrating the configuration of an inductance element for a magnetic sensor according to a seventh embodiment of the present invention.

FIG. 23 is a schematic exploded perspective view illustrating the configuration of an inductance element for a magnetic sensor 200C according to the seventh embodiment of the present invention.

As illustrated in FIG. 23, the inductance element for a magnetic sensor 200C according to the present embodiment differs from the inductance element for a magnetic sensor 200A according to the fifth embodiment in that it further has an insulating substrate 215 provided between the insulating substrates 213 and 214 and that a magnetic shield 260 is provided on an upper surface 215a of the insulating substrate 215. The upper surface 215a of the insulating substrate 215 constitutes an eighth surface S8. Other configurations are the same as those of the inductance element for a magnetic sensor 200A according to the fifth embodiment, so the same reference numerals are given to the same elements, and overlapping description will be omitted.

The magnetic shield 260 is provided so as to cover the saturable magnetic thin-plate core 230 to thereby detour magnetic flux acting as noise. Also in the present embodiment, the magnetic flux acting as noise is magnetic flux in the y-direction. The magnetic flux in the y-direction is detoured to the magnetic shield 260 without passing the saturable magnetic thin-plate core 230, whereby directivity with respect to magnetic flux in the x-direction to be detected can be enhanced.

Figure 24:
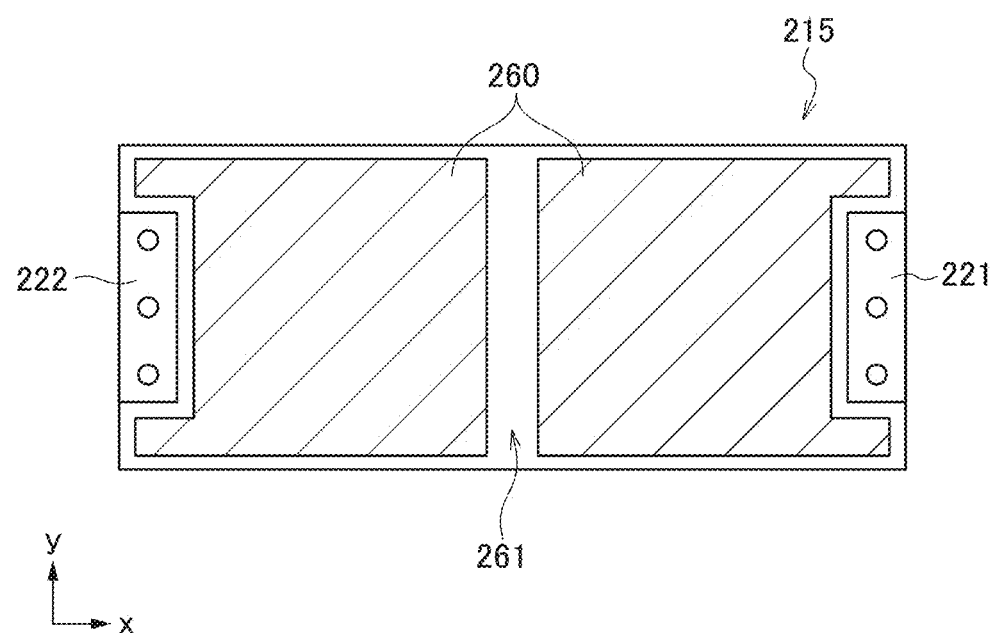
FIG. 24 is a plan view for explaining a modification of a pattern structure on the insulating substrate.

Further, as illustrated in FIG. 24, a slit 261 may be formed in the magnetic shield 260 to segment the magnetic shield 260 in the x-direction. The slit 261 thus formed in the magnetic shield 260 functions as a gap serving as magnetic resistance against magnetic flux in the x-direction, thereby making it possible to prevent deterioration in detection sensitivity due to detouring of the magnetic flux in the x-direction to be detected to the magnetic shield 260.

Eighth Embodiment

Figure 25:
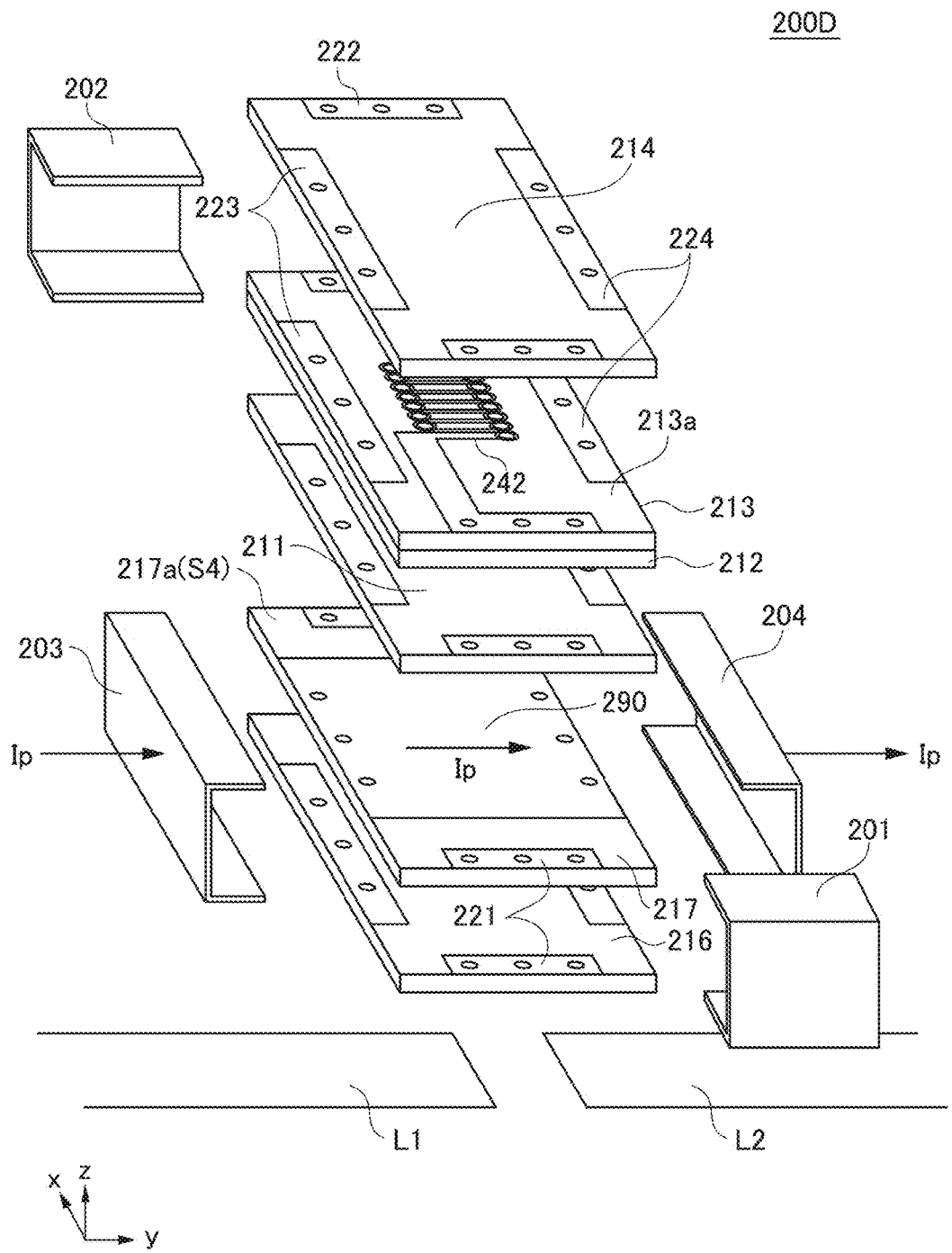
FIG. 25 is a schematic exploded perspective view illustrating the configuration of an inductance element for a magnetic sensor according to an eighth embodiment of the present invention.

FIG. 25 is a schematic exploded perspective view illustrating the configuration of an inductance element for a magnetic sensor 200D according to the eighth embodiment of the present invention.

As illustrated in FIG. 25, the inductance element for a magnetic sensor 200D according to the present embodiment further has insulating substrates 216 and 217 provided below the insulating substrate 211. A bus bar layer 290 is provided on an upper surface 217a of the insulating substrate 217. The upper surface 217a constitutes a fourth surface S4. The bus bar layer 290 is a conductor pattern through which the current Ip to be measured flows. One end of the bus bar layer 290 in the y-direction is connected to a terminal electrode 203, and the other end thereof in the y-direction is connected to a terminal electrode 204. The bus bar layer 290 and the terminal electrodes 203 and 204 are connected through conductor patterns 223 and 224 provided on the upper surfaces 213a and 214a of the respective insulating substrates 213 and 214. The conductor pattern 223 and the bus bar layer 290 are connected to each other through through hole conductors, and the conductor pattern 224 and the bus bar layer 290 are also connected to each other through through hole conductors.

Further, in the present embodiment, a conductor pattern that connects the coil conductor 240 and the terminal electrodes 201 and 202 is disposed on the upper surface 213a of the insulating substrate 213 in order to reduce a capacitance component generated between the bus bar layer 290 and the coil conductor 240. Other configurations are the same as those of the inductance element for a magnetic sensor 200A according to the fifth embodiment, so the same reference numerals are given to the same elements, and overlapping description will be omitted.

Figure 26:
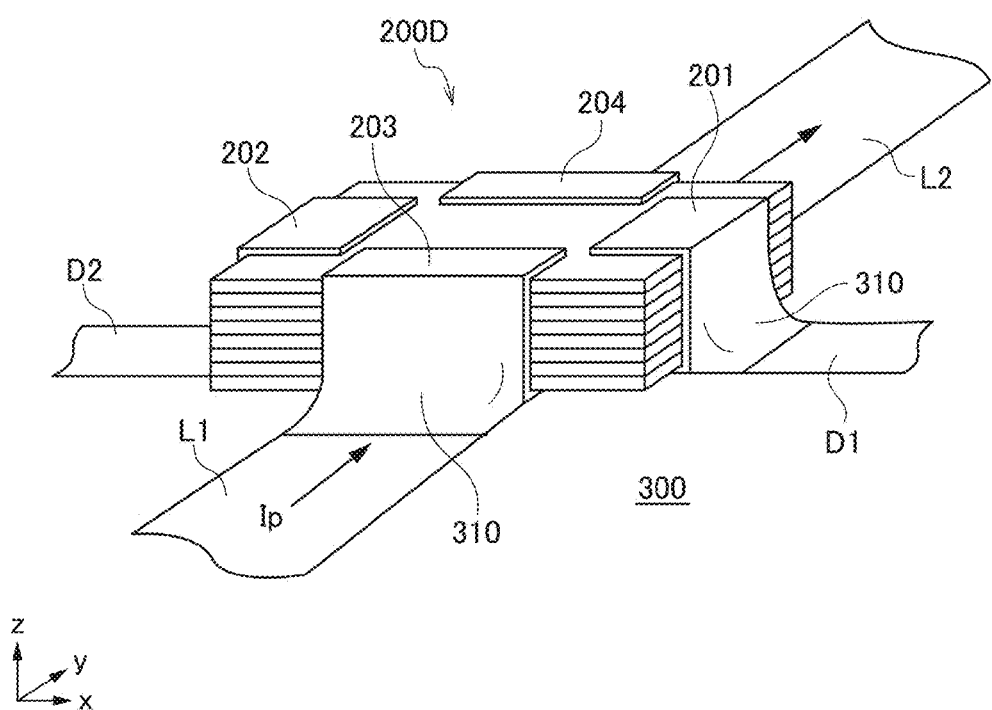
FIG. 26 is a schematic perspective view illustrating a state where the inductance element for a magnetic sensor shown in FIG. 25 is mounted on a circuit board.

The bus bar layer 290 is provided so as to overlap the saturable magnetic thin-plate core 230 in a plan view. FIG. 25 also illustrates wiring patterns L1 and L2 provided on the printed circuit board 300, and by mounting the inductance element for a magnetic sensor 200D on the printed circuit board 300, the structure illustrated in FIG. 26 can be obtained. In the present embodiment, the wiring pattern on the printed circuit board 300 through which the current Ip to be measured flows is divided into the wiring patterns L1 and L2. The wiring pattern L1 is connected to the terminal electrode 203, and the wiring pattern L2 is connected to the terminal electrode 204, whereby the current Ip to be measured flows by way of the bus bar layer 290.

As described above, in the present embodiment, the bus bar layer 290 through which the current Ip to be measured flows is provided inside the base body, so that it is possible to prevent measurement error due to variation in implementation. In addition, the distance between the bus bar layer 290 and the saturable magnetic thin-plate core 230 in the z-direction can be reduced, so that high measurement sensitivity can be obtained.

Also in the present embodiment, the magnetic shield may be provided between the insulating substrates 216 and 217 or between the insulating substrates 213 and 214. With this configuration, the magnetic sensor is less subjected to influence of noise.

Ninth Embodiment

Figure 27:
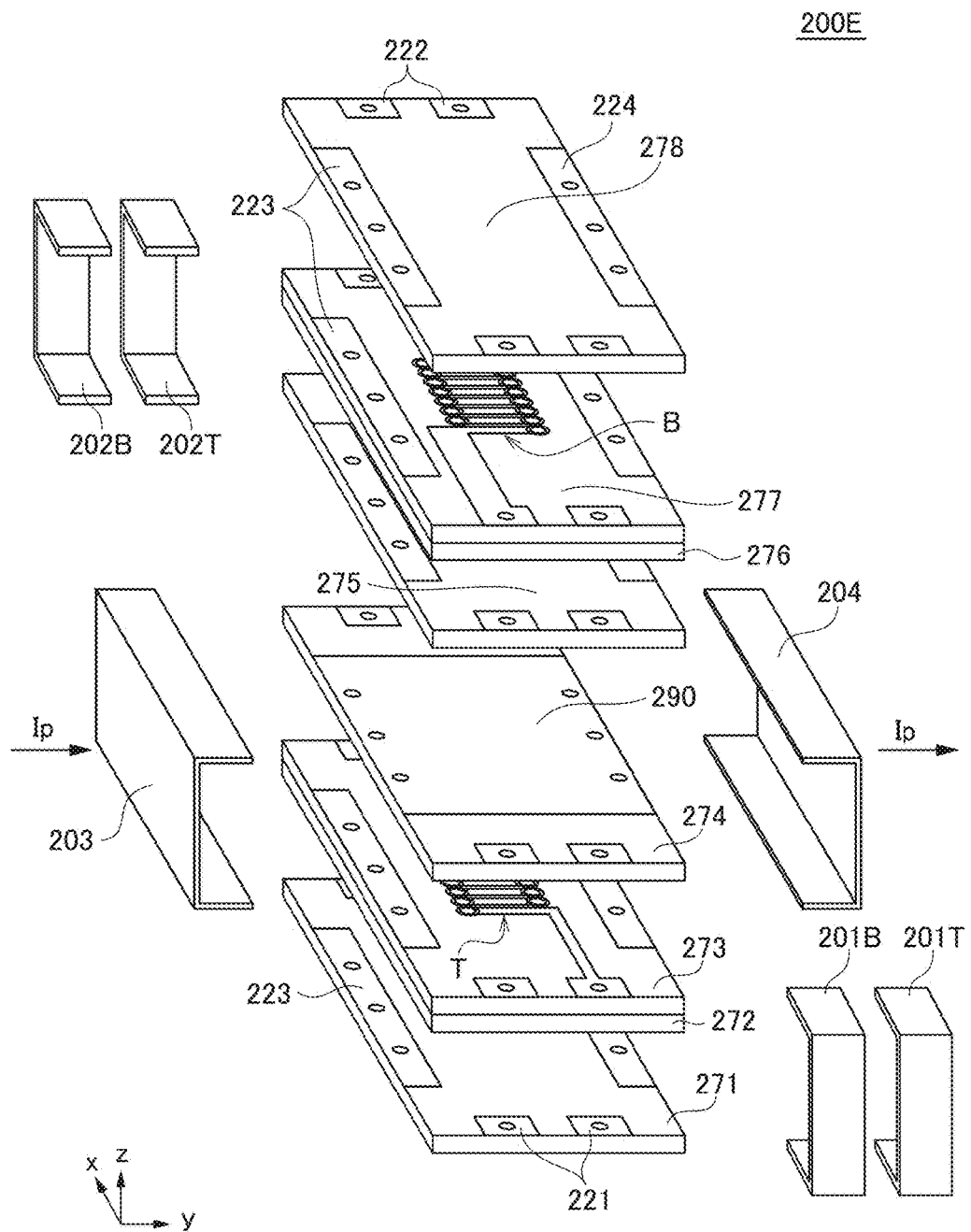
FIG. 27 is a schematic exploded perspective view illustrating the configuration of an inductance element for a magnetic sensor according to a ninth embodiment of the present invention.

FIG. 27 is a schematic exploded perspective view illustrating the configuration of an inductance element for a magnetic sensor 200E according to the ninth embodiment of the present invention.

As illustrated in FIG. 27, the inductance element for a magnetic sensor 200E according to the present embodiment has a base body constituted of a plurality of laminated insulating substrates 271 to 278, terminal electrodes 201T and 201B provided at one end of the base body in the x-direction, terminal electrodes 202T and 202B provided at the other end of the base body in the x-direction, and terminal electrodes 203 and 204 provided at both ends of the base body in the y-direction.

Figure 28:
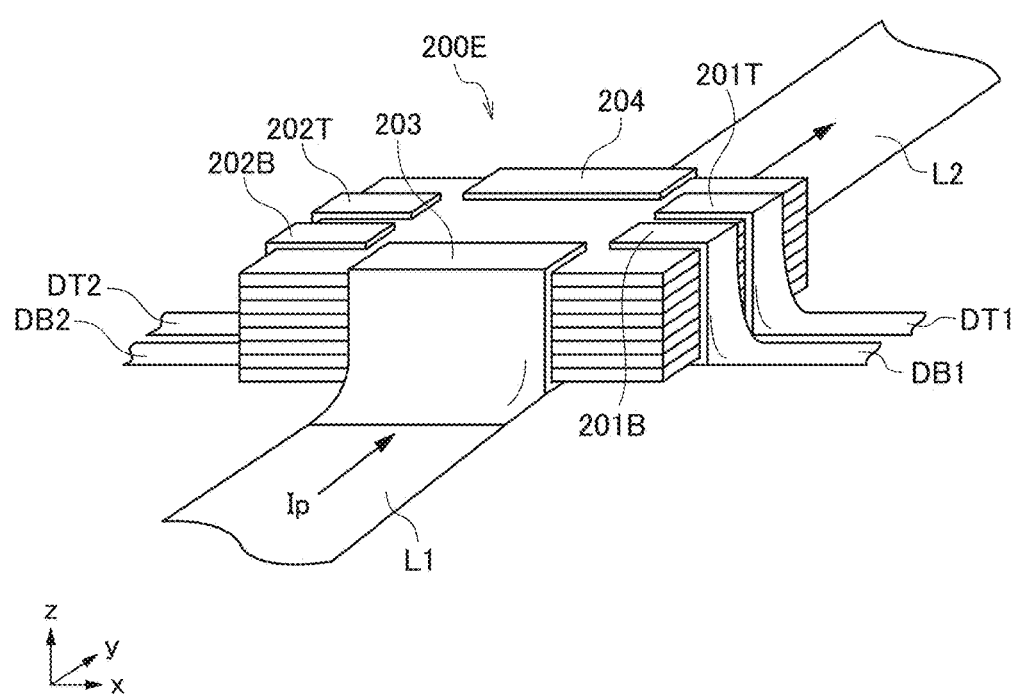
FIG. 28 is a schematic perspective view illustrating a state where the inductance element for a magnetic sensor shown in FIG. 27 is mounted on a circuit board.

The saturable magnetic thin-plate core 230 and the coil conductor 240 described by way of FIG. 17 are formed on the surfaces of the insulating substrates 272 and 273, thereby constituting a first inductance element T. The both ends of the coil conductor 240 included in the first inductance element T are connected to the terminal electrodes 201T and 202T, respectively. Similarly, the saturable magnetic thin-plate core 230 and coil conductor 240 described using FIG. 17 are formed on the surfaces of the insulating substrates 276 and 277, thereby constituting a second inductance element B. The both ends of the coil conductor 240 included in the second inductance element B are connected to the terminal electrodes 201B and 202B, respectively. As illustrated in FIG. 28, when the inductance element for a magnetic sensor 200E according to the present embodiment is mounted on the printed circuit board 300, the terminal electrodes 201T and 201B are connected respectively to wiring patterns DT1 and DB1, and the terminal electrodes 202T and 202B are connected respectively to wiring patterns DT2 and DB2.

The bus bar layer 290 is formed on an upper surface 274a of the insulating substrate 274. As described above, the bus bar layer 290 is a conductor pattern through which the current Ip to be measured flows. One end of the bus bar layer 290 in the y-direction is connected to the terminal electrode 203, and the other end thereof in the y-direction is connected to the terminal electrode 204.

Thus, the bus bar layer 290 is sandwiched between the first inductance element T and the second inductance element B in the lamination direction (z-direction). As a result, when the current Ip to be measured flows through the bus bar layer 290 in the y-direction, magnetic fluxes in the opposite directions are applied respectively to the first inductance element T and the second inductance element B.

Figure 29:
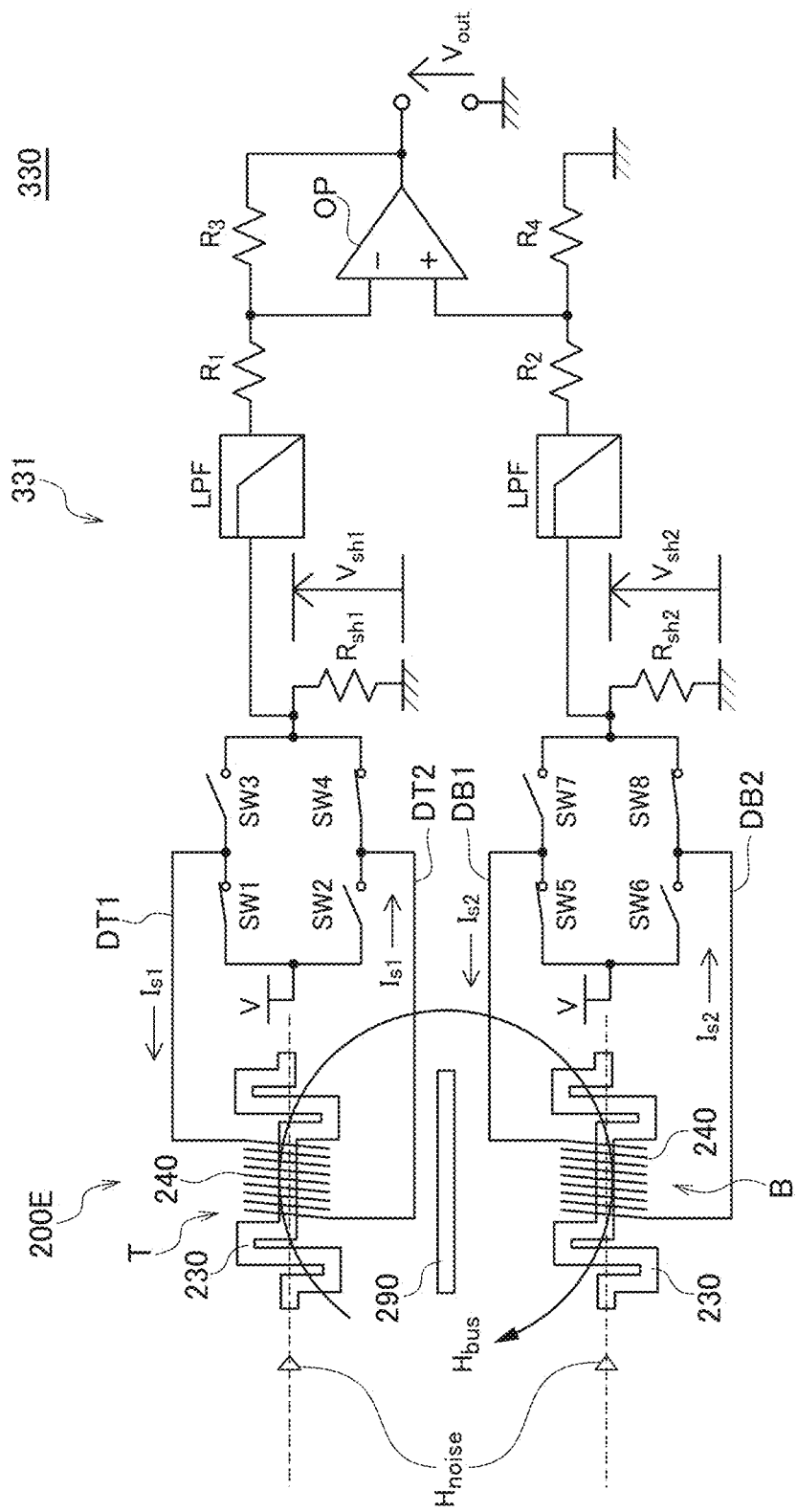
FIG. 29 is a circuit diagram of a magnetic sensor provided with the inductance element shown in FIG. 27.

FIG. 29 is a circuit diagram of a magnetic sensor 330 provided with the inductance element 200E.

The magnetic sensor 330 illustrated in FIG. 29 includes the inductance element 200E and a detection circuit 331. The detection circuit 331 includes a bridge circuit constituted of switches SW1 to SW4 and a bridge circuit constituted of switches SW5 to SW8. By controlling these switches SW1 to SW8, a current $I_{s1}$ to be detected is made to flow through the coil conductor 240 included in the first inductance element T, and a current $I_{s2}$ to be detected is made to flow through the coil conductor 240 included in the second inductance element B. The current $I_{s1}$ to be detected is converted into a voltage $V_{sh1}$ to be detected by a resistor $R_{sh1}$, and the current $I_{s2}$ to be detected is converted into a voltage $V_{sh2}$ to be detected by a resistor $R_{sh2}$. The voltage $V_{sh1}$ to be detected and the voltage $V_{sh2}$ to be detected are input to an operation amplifier OP and a differential amplifier constituted of resistors R1 to R4 by way of respective low-pass filters LPF. With this configuration, a difference between an output of the first inductance element T and output of the second inductance element B appears as an output voltage $V_{out}$.

As schematically illustrated in FIG. 29, the bus bar layer 290 is disposed between the first inductance element T and the second inductance element B, so that when the current Ip to be measured flows through the bus bar layer 290, an external magnetic field $H_{bus}$ is generated, whereby the first inductance element T and second inductance element B are varied in inductance. The direction of the magnetic flux to be applied to the first inductance element T is opposite by 180° to the direction of the magnetic flux to be applied to the second inductance element B, so that the level of the output voltage $V_{out}$ of the differential amplifier is doubled. In addition, a noise component $H_{noise}$ which is common mode with respect to the first and second inductance elements T and B like terrestrial magnetism is removed by the differential amplifier.

As described above, by using the inductance element for a magnetic sensor 200E according to the present embodiment, a magnetic sensor (current sensor) which is less likely to be affected by noise such as terrestrial magnetism and high in sensitivity can be realized. Further, in the present embodiment, the first and second inductance elements T and B are formed on different layers, so that the planar size of the insulating substrate constituting the base body is not increased.

Also in the present embodiment, the magnetic shield may be provided between the insulating substrates 271 and 272 or between the insulating substrates 277 and 278. With this configuration, the magnetic sensor is less subjected to influence of noise.

Tenth Embodiment

Figure 30:
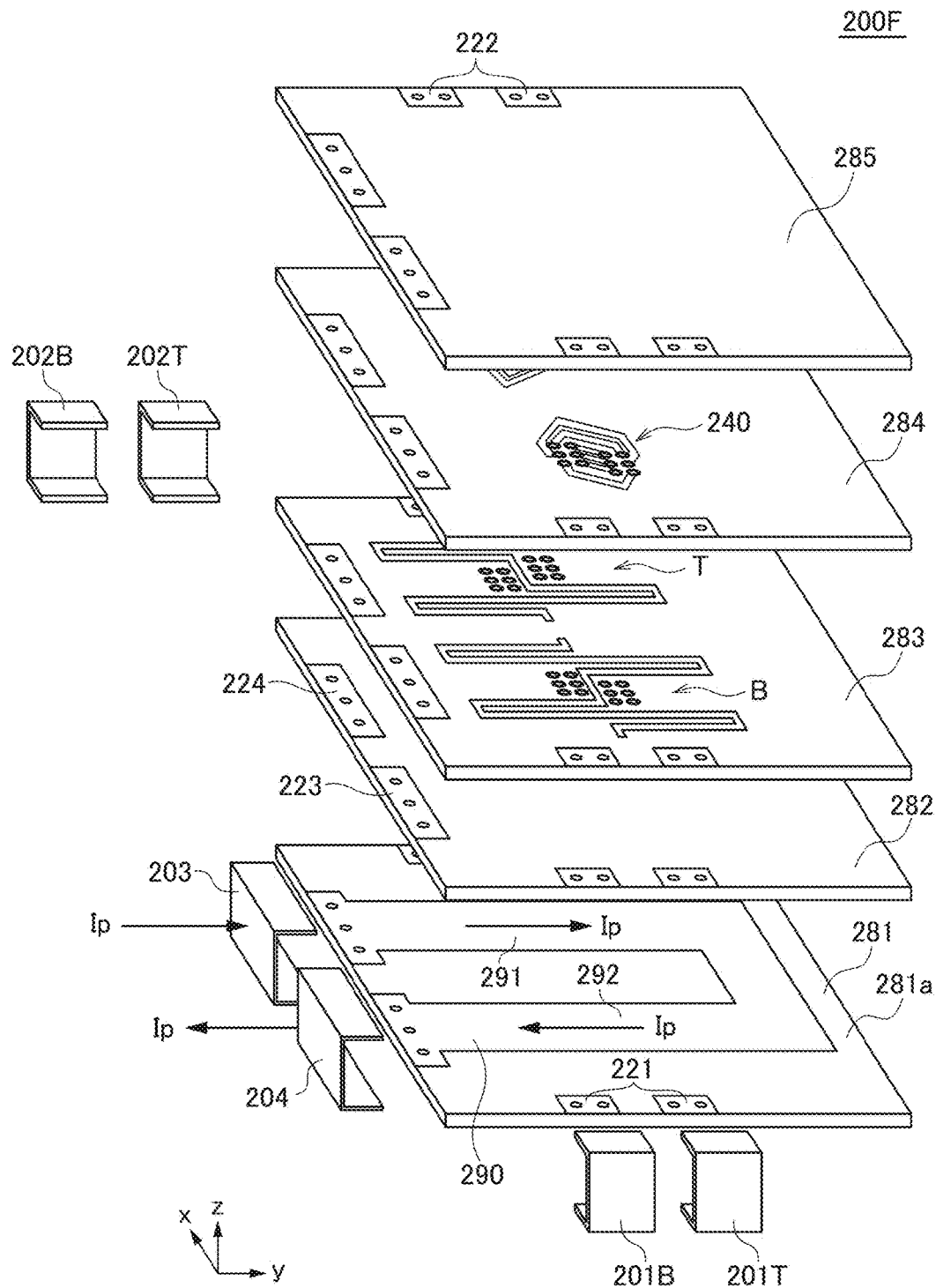
FIG. 30 is a schematic exploded perspective view illustrating the configuration of an inductance element for a magnetic sensor according to a tenth embodiment of the present invention.

FIG. 30 is a schematic exploded perspective view illustrating the configuration of an inductance element for a magnetic sensor 200F according to the tenth embodiment of the present invention.

As illustrated in FIG. 30, the inductance element for a magnetic sensor 200F according to the present embodiment has a base body constituted of a plurality of laminated insulating substrates 281 to 285, terminal electrodes 201T and 201B provided at one end of the base body in the x-direction, terminal electrodes 202T and 202B provided at the other end of the base body in the x-direction, and terminal electrodes 203 and 204 provided at one end of the base body in the y-direction.

Two sets of the saturable magnetic thin-plate core 230 and coil conductor 240 described using FIG. 17 are formed on the surface of the insulating substrate 283, thereby constituting the first and second inductance elements T and B. The both ends of the coil conductor 240 included in the first inductance element T are connected to the terminal electrodes 201T and 202T, respectively, and the both ends of the coil conductor 240 included in the second inductance element B are connected to the terminal electrodes 201B and 202B, respectively.

The bus bar layer 290 is formed on an upper surface 281a of the insulating substrate 281. In the present embodiment, the bus bar layer 290 has a planar shape folded back in the y-direction, whereby the current Ip to be measured flows through a first bus bar pattern 291 and a second bus bar pattern 292 in mutually 180° different directions. The first bus bar pattern 291 is disposed so as to overlap the first inductance element T in a plan view, and the second bus bar pattern 292 is disposed so as to overlap the second inductance element B in a plan view.

Figure 31:
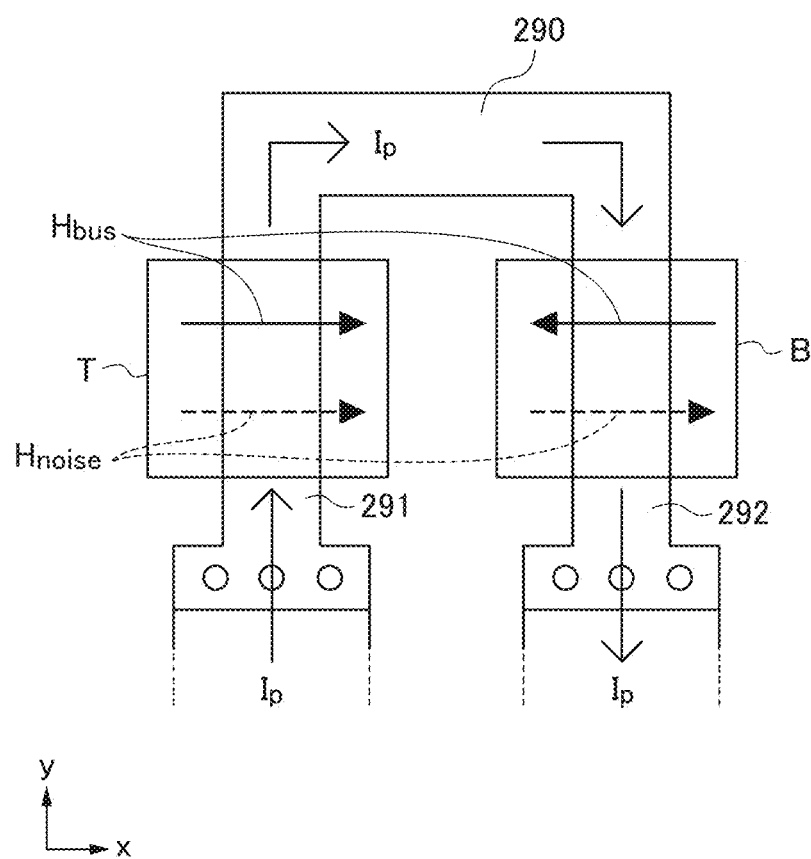
FIG. 31 is a schematic diagram for explaining a direction of the current to be measured flows through the bus bar layer and a direction of the magnetic flux.

Thus, as illustrated in FIG. 31, when the current Ip to be measured flows through the bus bar layer 290, the magnetic flux flows in the opposite directions in the magnetic fields $H_{bus}$ applied to the respective first and second inductance elements T and B. On the other hand, the noise component $H_{noise}$ is common mode with respect to the first and second inductance elements T and B. As a result, like the inductance element for a magnetic sensor 200E according to the ninth embodiment, a magnetic sensor (current sensor) which is less likely to be affected by noise such as terrestrial magnetism and high in sensitivity can be realized. Further, in the present embodiment, the first and second inductance elements T and B are formed on the same layer, so that the number of the insulating substrates constituting the base body can be reduced.

Eleventh Embodiment

Figure 32:
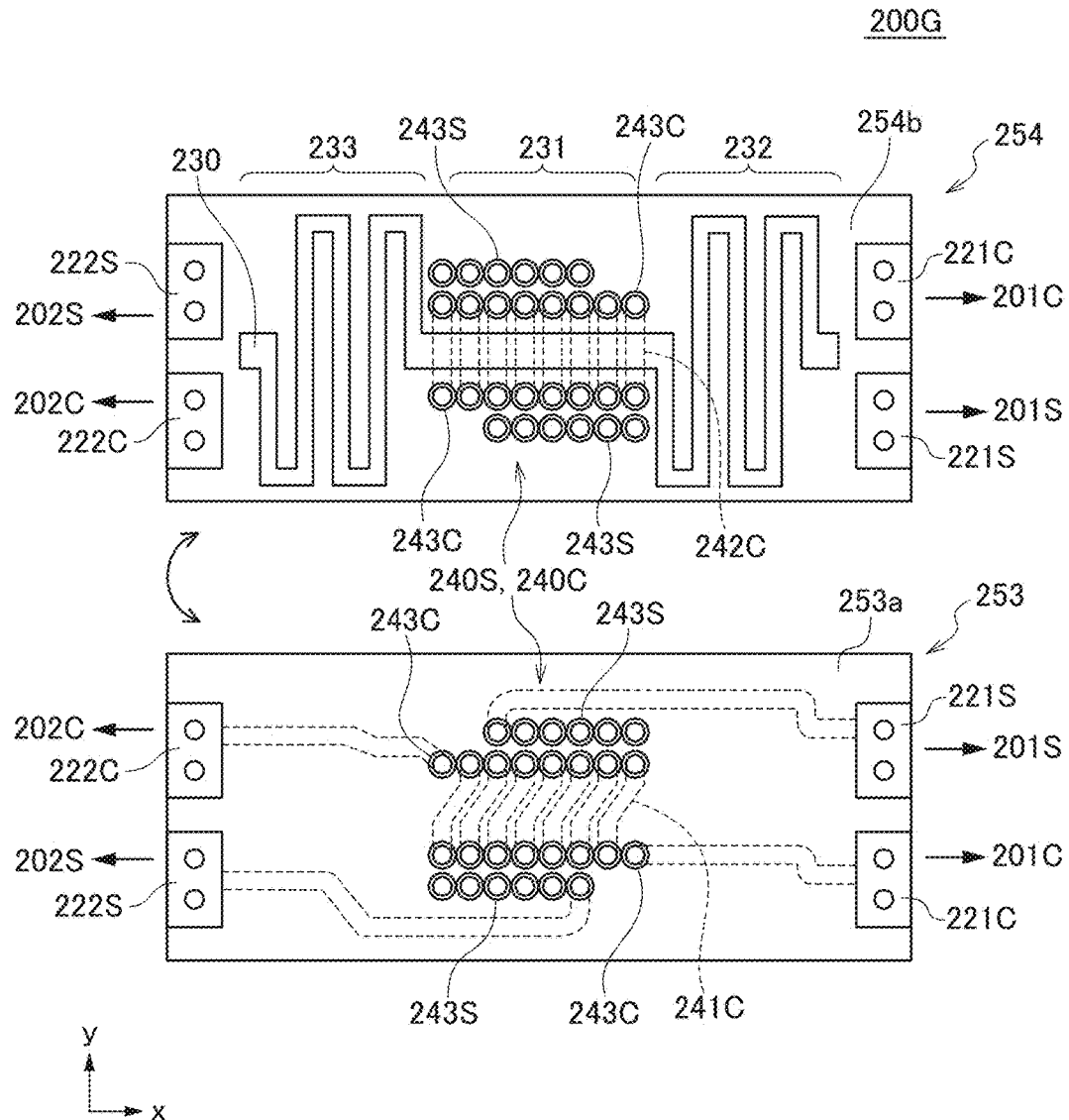
FIG. 32 is a plan view illustrating the configuration of the main part of an inductance element for a magnetic sensor according to an eleventh embodiment of the present invention.

FIG. 32 is a plan view illustrating the configuration of the main part of an inductance element for a magnetic sensor 200G according to an eleventh embodiment of the present invention.

The inductance element for a magnetic sensor 200G according to the present embodiment is similar in the configuration of the base body to the inductance element for a magnetic sensor 200B illustrated in FIGS. 21 and 22 and has six insulating substrates 251 to 256. In FIG. 32, the insulating substrate 253 is viewed from an upper surface 253a side thereof, and the insulating substrate 254 is viewed from a lower surface 254b side thereof.

Figure 33:
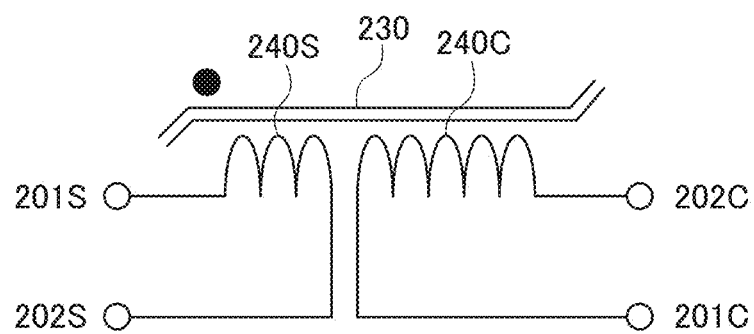
FIG. 33 is an equivalent circuit diagram of the inductance element for a magnetic sensor shown in FIG. 32.

As illustrated in FIG. 32, in the present embodiment, the coil conductor 240 includes a detection coil 240S and a compensation coil 240C which are wound around the first section 231 of the saturable magnetic thin-plate core 230 in common. The detection coil 240S includes planar conductor patterns 241S and 242S and a through hole conductor 243S. One end of the detection coil 240S is connected to a terminal electrode 201S through a conductor pattern 221S, and the other end thereof is connected to a terminal electrode 202S through a conductor pattern 222S. The compensation coil 240C includes planar coil patterns 241C and 242C and a through hole conductor 243C. One end of the compensation coil 240C is connected to a terminal electrode 201C through a conductor pattern 221C, and the other end thereof is connected to a terminal electrode 202C through a conductor pattern 222C. With this configuration, the inductance element for a magnetic sensor 200G according to the present embodiment constitutes the circuit illustrated in FIG. 33. Although the detection coil 240S is wound outside the compensation coil 240C in the example illustrated in FIG. 32, the compensation coil 240C may be wound outside the detection coil 240S.

Figure 34:
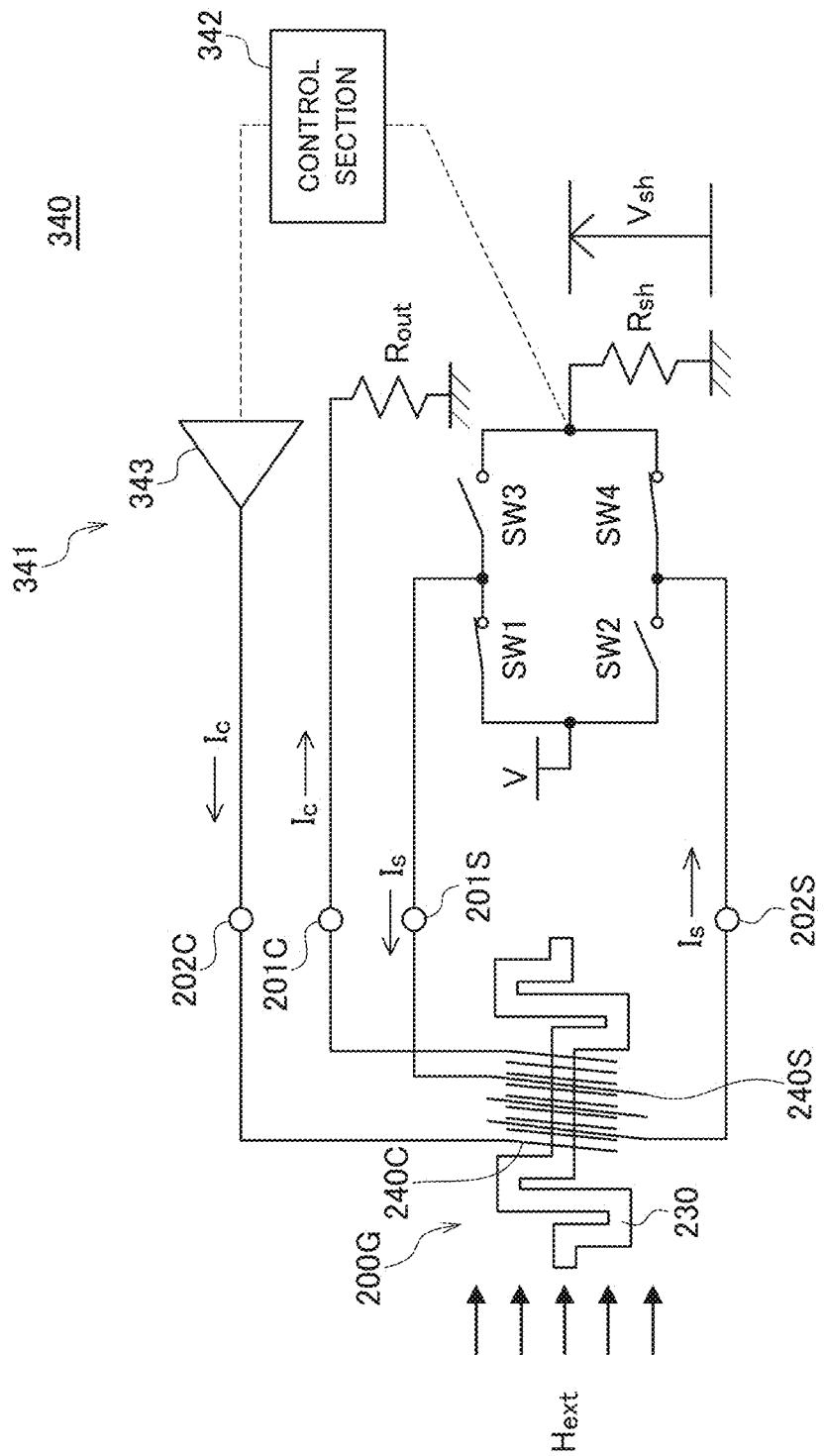
FIG. 34 is a circuit diagram of a magnetic sensor provided with the inductance element shown in FIG. 32.

FIG. 34 is a circuit diagram of a magnetic sensor 340 provided with the inductance element 200G.

The magnetic sensor 340 illustrated in FIG. 34 includes the inductance element 200G and a detection circuit 341. The detection circuit 341 includes a bridge circuit constituted of switches SW1 to SW4. By controlling these switches SW1 to SW4, a current $I_s$ to be detected is made to flow through the detection coil 240S. The current $I_s$ depends on the strength of the external magnetic field $H_{ext}$. The current $I_s$ to be detected is converted into the voltage $V_{sh}$ to be detected by the resistor $R_{sh}$ and input to a control section 342. The control section 342 controls a driver 343 based on the voltage $V_{sh}$ to be detected to drive the terminal electrode 202C to a predetermined potential. As illustrated in FIG. 34, the terminal electrode 201C is grounded through a resistor $R_{out}$, so that when the terminal electrode 202C is driven to a predetermined potential, a compensation current $I_c$ flows through the compensation coil 240C. The control section 342 performs control so that the external magnetic field $H_{ext}$ is canceled by the compensation current $I_c$.

As described above, using the inductance element for a magnetic sensor 200G according to the present embodiment allows measurement of the strength of the external magnetic field $H_{ext}$ by closed-loop control.

It is apparent that the present invention is not limited to the above embodiments, but may be modified and changed without departing from the scope and spirit of the invention.

What is claimed is:

1. An inductance element comprising:
    a base body;
    a saturable magnetic thin-plate core provided on the base body; and
    a coil conductor wound around the saturable magnetic thin-plate core,
    wherein the saturable magnetic thin-plate core includes a first section linearly extending in a first direction and a second section having a meander-shaped, and
    wherein the coil conductor is wound around the first section of the saturable magnetic thin-plate core.

2. The inductance element as claimed in claim 1,
    wherein the saturable magnetic thin-plate core further includes a third section having a meander-shaped, and
    wherein both ends of the first section are connected to the second and third sections, respectively.

3. The inductance element as claimed in claim 1,
    wherein the saturable magnetic thin-plate core further includes a fourth section linearly extending in the first direction, and
    wherein both ends of the second section are connected to the first and fourth sections, respectively.

4. The inductance element as claimed in claim 1,
    wherein the base body includes a first mounting area having a first width in a second direction substantially perpendicular to the first direction and a second mounting area having a second width in the second direction larger than the first width,
    wherein the first section of the saturable magnetic thin-plate core is provided on the first mounting area of the base body,
    wherein the second section of the saturable magnetic thin-plate core is provided on the second mounting area of the base body, and
    wherein the coil conductor is wound around the first mounting area of the base body.

5. The inductance element as claimed in claim 4, further comprising a terminal electrode provided on the second mounting area of the base body,
    wherein an end portion of the coil conductor is connected to the terminal electrode.

6. The inductance element as claimed in claim 4, further comprising a magnetic shield fixed to the second mounting area of the base body so as to detour magnetic flux in the second direction.

7. The inductance element as claimed in claim 1,
    wherein the base body includes a plurality of laminated insulating substrates, the insulating substrates having at least first, second, and third surfaces,
    wherein the saturable magnetic thin-plate core is formed on the first surface, and
    wherein the coil conductor includes:
        a first planar coil pattern formed on the second surface;
        a second planar coil pattern formed on the third surface; and
        a first through hole conductor formed so as to penetrate at least one of the plurality of insulating substrates so as to connect the first and second planar conductor patterns.

8. The inductance element as claimed in claim 7,
    wherein the plurality of insulating substrates includes at least first, second, third, and fourth insulating substrates laminated in this order,
    wherein the first surface is positioned between the second and third insulating substrates,
    wherein the second surface is positioned between the first and second insulating substrates, and
    wherein the third surface is positioned between the third and fourth insulating substrates.

9. The inductance element as claimed in claim 8, further comprising a bus bar layer through which a current to be measured flows,
    wherein the insulating substrates further has a fourth surface on which the bus bar layer is formed.

10. The inductance element as claimed in claim 9,
    wherein the saturable magnetic thin-plate core includes first and second saturable magnetic thin-plate cores,
    wherein the coil conductor includes first and second coil conductors,
    wherein the first coil conductor is wound around the first section of the first saturable magnetic thin-plate core,
    wherein the second coil conductor is wound around the first section of the second saturable magnetic thin-plate core,
    wherein the insulating substrates further has a fifth to seventh surfaces,
    wherein the first saturable magnetic thin-plate core is formed on the first surface,
    wherein the first coil conductor includes:
        the first planar conductor pattern formed on the second surface;
        the second planar conductor pattern formed on the third surface; and
        the first through hole conductor,
    wherein the second saturable magnetic thin-plate core is formed on the fifth surface,
    wherein the second coil conductor includes:
        the third planar conductor pattern formed on the sixth surface;
        the fourth planar conductor pattern formed on the seventh surface; and
        a second through hole conductor formed so as to penetrate at least one of the plurality of insulating substrates so as to connect the third and fourth planar conductor patterns, and
    wherein the fourth surface is positioned between the first to third surfaces and the fifth to seventh surfaces.

11. The inductance element as claimed in claim 9,
    wherein the saturable magnetic thin-plate core includes first and second saturable magnetic thin-plate cores,
    wherein the coil conductor includes first and second coil conductors,
    wherein the first coil conductor is wound around the first section of the first saturable magnetic thin-plate core,
    wherein the second coil conductor is wound around the first section of the second saturable magnetic thin-plate core,
    wherein both the first and second saturable magnetic thin-plate cores are formed on the first surface,
    wherein the first coil conductor includes:
        the first planar conductor pattern formed on the second surface;

the second planar conductor pattern formed on the third surface; and the first through hole conductor, wherein the second coil conductor includes:
- the third planar conductor pattern formed on the second surface;
- the fourth planar conductor pattern formed on the third surface; and
- a second through hole conductor formed so as to penetrate at least one of the plurality of insulating substrates so as to connect the third and fourth planar conductor patterns, wherein the bus bar layer includes:
- a first bus bar pattern formed so as to overlap the first saturable magnetic thin-plate core when viewed in a lamination direction, and
- a second bus bar pattern formed so as to overlap the second saturable magnetic thin-plate core when viewed in the lamination direction, and wherein the current to be measured flows in mutually opposite directions through the first and second bus bar patterns.

12. The inductance element as claimed in claim 7, further comprising a magnetic shield detouring magnetic flux in a second direction substantially perpendicular to the first direction wherein the insulating substrates further has an eighth surface on which the magnetic shield is formed.

13. The inductance element as claimed in claim 12, wherein the magnetic shield has a gap serving as magnetic resistance against magnetic flux in the first direction.

14. The inductance element as claimed in claim 1, wherein the coil conductor includes a detection coil and a compensation coil wounded in common around the first section of the saturable magnetic thin-plate core.

15. The inductance element as claimed in claim 1, wherein the saturable magnetic thin-plate core is made of amorphous magnetic metal.

16. A magnetic sensor comprising:
an inductance element comprising:
- a base body;
- a saturable magnetic thin-plate core provided on the base body; and
- a coil conductor wound around the saturable magnetic thin-plate core, and a detection circuit connected to the coil conductor, wherein the saturable magnetic thin-plate core includes a first section linearly extending in a first direction and a second section having a meander-shaped, and wherein the coil conductor is wound around the first section of the saturable magnetic thin-plate core.

* * * * *